(12) United States Patent
Kondo

(10) Patent No.: US 10,084,027 B2
(45) Date of Patent: Sep. 25, 2018

(54) DISPLAY PANEL AND METHOD OF MANUFACTURING SAME

(71) Applicant: JOLED INC., Tokyo (JP)

(72) Inventor: Tetsuro Kondo, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/413,797

(22) Filed: Jan. 24, 2017

(65) Prior Publication Data

US 2017/0213881 A1   Jul. 27, 2017

(30) Foreign Application Priority Data

Jan. 25, 2016   (JP) ................. 2016-011385

(51) Int. Cl.
*H01L 35/24* (2006.01)
*H01L 51/00* (2006.01)
*H01L 27/32* (2006.01)
*H01L 51/52* (2006.01)

(52) U.S. Cl.
CPC ...... *H01L 27/3246* (2013.01); *H01L 27/3211* (2013.01); *H01L 51/5228* (2013.01); *H01L 27/3279* (2013.01)

(58) Field of Classification Search
None
See application file for complete search history.

(56) References Cited

U.S. PATENT DOCUMENTS

| | | |
|---|---|---|
| 2009/0273279 A1 | 11/2009 | Chino et al. |
| 2012/0091439 A1 | 4/2012 | Nishiyama et al. |
| 2015/0053948 A1 | 2/2015 | Matsushima |
| 2017/0117339 A1* | 4/2017 | Takata ............ H01L 51/50 |

FOREIGN PATENT DOCUMENTS

| | | |
|---|---|---|
| JP | 2009-272081 A | 11/2009 |
| JP | 2010-277944 A | 12/2010 |
| JP | 2010-282903 A | 12/2010 |
| WO | 2012/017494 A1 | 2/2012 |
| WO | 2013/118196 A1 | 8/2013 |

* cited by examiner

*Primary Examiner* — Thien F Tran
(74) *Attorney, Agent, or Firm* — McDermott Will & Emery LLP

(57) ABSTRACT

A display panel 1 includes a substrate 12, a first column bank 30A, a second column bank 30B, a third column bank 30C, first row banks 40A in a first column region 35A, second row banks 40B in a second column region 35B, blue organic light-emitting elements 11B, and green organic light-emitting elements 11G. The number of high row banks between blue organic light-emitting elements is less than the number of high row banks between green organic light-emitting elements.

14 Claims, 15 Drawing Sheets

DISPLAY PANEL AND METHOD OF MANUFACTURING SAME

This application is based on an application No. 2016-11385 filed in Japan, the contents of which are hereby incorporated by reference.

BACKGROUND (1) Technical Field

The present invention relates to display panels that have a plurality of organic light-emitting elements, and in particular to a structure of banks partitioning organic light-emitting elements.

(2) Description of Related Art

In recent years, display panels that have a plurality of organic light-emitting elements are being developed. Among such display panels, there are display panels in which organic light-emitting elements are in sub pixel regions surrounded by column banks and row banks on a substrate. With respect to a height from a top surface of a substrate to top surfaces of the row banks (hereinafter, "row bank height"), it has been proposed to make the row bank height less than a height from the top surface of the substrate to top surfaces of the column banks (hereinafter, "column bank height") (WO2012/017494A1) and to make the row bank height match the column bank height (JP2009-272081). In any configuration, an organic light-emitting layer included in an organic light-emitting element can be obtained by applying ink containing an organic light-emitting material to a sub pixel region surrounded by column banks and row banks, then drying the ink. Inks containing organic light-emitting materials of different colors are applied to sub pixel regions that are adjacent to each other in a row direction, which is the direction in which the row banks extend, and ink containing organic light-emitting material of the same color is applied to sub pixel regions that are adjacent to each other in a column direction, which is the direction in which the column banks extend.

As shown in WO2012/017494A1, when the row bank height is made lower than the column bank height, ink applied to sub pixel regions that are adjacent to each other in the column direction crosses the row banks and connects. Even if there is a difference in amounts of ink applied to the sub pixel regions that are adjacent to each other in the column direction, the amounts of ink can be equalized. Thus, variation in film thicknesses of organic light-emitting layers that are adjacent to each other in the column direction can be suppressed. Film thickness of an organic light-emitting layer affects properties such as brightness and lifetime of an organic light-emitting element, and therefore suppressing variation in film thicknesses of organic light-emitting layers can suppress variation in properties of organic light-emitting elements. This is not limited to organic light-emitting layers, and as long as a layer constitutes an organic functional layer formed by application of ink, variation in film thickness of the layer can be suppressed, thereby suppressing variation in organic light-emitting elements. Examples of layers that constitute an organic functional layer other than the organic light-emitting layer include a hole injection layer, a hole transport layer, an electron injection layer, and an electron transport layer. However, when manufacturing a display panel, sometimes a portion of a column bank is unintentionally chipped or foreign matter adheres to a column bank, and therefore a defective portion occurs that makes it impossible for the column bank to block ink flow. When a defective portion occurs in a column bank, inks of different colors applied to sub-pixel regions that are adjacent to each other across the column bank sometimes penetrate through the defective portion. Furthermore, since ink of the same color in the column direction is connected, an ink of a different light-emission color that has penetrated via the defective portion is not limited to only the sub pixel region initially entered, and may penetrate into sub pixel regions that are adjacent in the column direction to the sub pixel region initially entered, and in some cases may further spread to other sub pixel regions in the column direction. In a sub pixel region in which inks of different light-emission colors have entered, an organic light-emitting element display error is caused by ink mixing. Thus, in addition to an organic light-emitting element adjacent to a defective portion of a column bank, display errors also occur in organic light-emitting elements adjacent to the organic light-emitting element.

On the other hand, as shown in JP2009-272081, when the row bank height is made to be equal to the column bank height, ink applied to sub pixel regions that are adjacent in the column direction is blocked by the row banks, and does not connect. Thus, even if an ink of a different light-emission color applied to a sub pixel region that is adjacent across a column bank penetrates through a defective portion, the ink stays in the sub pixel region it enters, and does not spread to other sub pixel regions that are adjacent in the column direction. Thus, organic light-emitting elements in which display errors occur can be limited to only organic light-emitting elements adjacent to the defective portion of the column bank, suppressing a spread of defective organic light-emitting elements due to the defective portion. However, when variation occurs in amounts of ink applied to sub pixel regions that are adjacent in the column direction, ink applied to the sub pixel regions is blocked by the row banks, and therefore equalizing of ink amounts in the sub pixel regions cannot occur, and variation in film thicknesses of organic functional layers that are adjacent in the column direction occurs. Thus, variation occurs in properties such as luminance and lifespan of organic light-emitting elements in the column direction.

SUMMARY OF THE INVENTION

Problem to be Solved

According to the conventional display panels described above, row bank height is uniform. However, a configuration may be considered in which a portion of the row banks are low row banks each having a height from a substrate lower than that of the column banks, and a remainder of the row banks are high row banks each having a height from the substrate higher than that of the low row banks. According to this configuration, when low row banks are sandwiched between high row banks, amounts of ink in each sub pixel region can be equalized within a region sandwiched between high row banks, and even when a defective portion occurs in a column bank, spread of defective organic light-emitting elements due to the defective portion can be suppressed.

However, as a result of studies on such a display panel, it has been found that even when variation in film thickness of organic functional layers is approximately the same in organic light-emitting elements of different light-emission colors, degrees of variation in brightness, lifespan, etc., of organic light-emitting elements arranged in the column direction are different. In organic light-emitting elements of different light-emission colors, when variation in film thickness of organic functional layers is approximately the same but variation in properties of organic light-emitting elements is large, it may be considered that the relative importance of equalizing ink amounts and suppressing spread of defective organic light-emitting elements due to defective portions may be different. Thus, for organic light-emitting elements that are greatly affected by variation in film thickness of organic functional layers, it is desirable to emphasize suppressing variation in film thickness of the organic functional layers while for the display panel as a whole it is desirable to suppress spread of defective organic light-emitting elements due to defective portions.

The present invention aims to provide a display panel that emphasizes suppression of variation in film thickness of organic functional layers for organic light-emitting elements that are greatly influenced by variation in film thickness of organic functional layers while suppressing spread of defective organic light-emitting elements due to defective portions for the display panel as a whole.

Means for Solving Problem

In view of the above, a display panel pertaining to one aspect of the present invention is a display panel comprising: a substrate; a first column bank, a second column bank, and a third column bank, disposed at spaced intervals on the substrate, each being elongated in a column direction; a plurality of first row banks disposed at spaced intervals in the column direction on the substrate in a first column region between the first column bank and the second column bank; a plurality of second row banks disposed at spaced intervals in the column direction on the substrate in a second column region between the second column bank and the third column bank; a plurality of first organic light-emitting elements disposed on the substrate in the first column region between adjacent ones of the first row banks; and a plurality of second organic light-emitting elements disposed on the substrate in the second column region between adjacent ones of the second row banks, emitting light in a color different from that of the first organic light-emitting elements, wherein the first row banks and the second row banks collectively include low row banks that have a height from a top surface of the substrate that is lower than that of the first column bank, the second column bank, and the third column bank, and high row banks that have a height from the top surface of the substrate that is higher than that of the low row banks, and a number of high row banks between adjacent ones of the first organic light-emitting elements is different from a number of high row banks between adjacent ones of the second organic light-emitting elements.

Further, according to another example of the display device, the number of the high row banks disposed between adjacent ones of the first light-emitting elements is three or more, and the high row banks disposed between adjacent ones of the first light-emitting elements are spaced at equal intervals.

Further, according to another example of the display device, all the first row banks are high row banks.

Further, according to another example of the display device, all the second row banks are low row banks.

Further, according to another example of the display device, the number of high row banks between adjacent ones of the first organic light-emitting elements is greater than the number of high row banks between adjacent ones of the second organic light-emitting elements, each of the first organic light-emitting elements includes an organic light-emitting layer that contains a first organic light-emitting material, each of the second organic light-emitting elements includes an organic light-emitting layer that contains a second organic light-emitting material that is different from the first organic light-emitting material, and the first organic light-emitting material has properties such that influence on brightness of differences in thickness of the organic light-emitting layer containing the first organic light-emitting material is less than influence on brightness of differences in thickness of the organic light-emitting layer containing the second organic light-emitting material.

Further, according to another example of the display device, the first organic light-emitting material is a material emitting red light, and the second organic light-emitting material is a material emitting blue light or a material emitting green light.

Further, according to another example of the display device, each of the first organic light-emitting elements includes an organic light-emitting layer that contains a first organic light-emitting material, each of the second organic light-emitting elements includes an organic light-emitting layer that contains a second organic light-emitting material that is different from the first organic light-emitting material, the number of high row banks between adjacent ones of the first organic light-emitting elements is greater than the number of high row banks between adjacent ones of the second organic light-emitting elements, the first organic light-emitting material is a material emitting red light, and the second organic light-emitting material is a material emitting blue light or a material emitting green light.

Further, according to another example of the display device, the display device further comprises: a fourth column bank disposed on the substrate spaced apart from the third column bank and elongated in the column direction; a plurality of third row banks disposed at spaced intervals in the column direction on the substrate in a third column region between the third column bank and the fourth column bank; and a plurality of third organic light-emitting elements disposed on the substrate in the third column region between adjacent ones of the third row banks, emitting light in a color different from that of the first organic light-emitting elements and different from that of the second organic light-emitting elements, wherein the number of high row banks between adjacent ones of the second organic light-emitting elements is greater than the number of high row banks between adjacent ones of the first organic light-emitting elements, and is greater than the number of high row banks between adjacent one of the third organic light-emitting elements, a plurality of sets are disposed at spaced intervals on the substrate along a direction perpendicular to the column direction, each set consisting of the first column bank, the first organic light-emitting elements, the second column bank, the second organic light-emitting elements, the third column bank, the third organic light-emitting elements, and the fourth column bank, and a plurality of auxiliary electrodes are disposed on the substrate in gaps between the sets, each extending in the column direction and supplying power to the first organic light-emitting elements, the second organic light-emitting elements, and the third organic light-emitting elements.

Further, according to another example of the display device, the display device further comprises: a fourth column bank disposed on the substrate spaced apart from the third column bank and elongated in the column direction; a plurality of third row banks disposed at spaced intervals in the column direction on the substrate in a third column region between the third column bank and the fourth column bank; and a plurality of third organic light-emitting elements disposed on the substrate in the third column region between adjacent ones of the third row banks, emitting light in a color different from that of the first organic light-emitting elements and different from that of the second organic light-emitting elements, wherein the number of high row banks between adjacent ones of the second organic light-emitting elements is greater than the number of high row banks between adjacent ones of the first organic light-emitting elements, and is greater than the number of high row banks between adjacent ones of the third organic light-emitting elements, a plurality of sets are disposed at spaced intervals on the substrate along a direction perpendicular to the column direction, each set consisting of the first column bank, the first organic light-emitting elements, the second column bank, the second organic light-emitting elements, the third column bank, the third organic light-emitting elements, and the fourth column bank, a plurality of auxiliary electrodes are disposed on the substrate in gaps between the sets, each extending in the column direction and supplying power to the first organic light-emitting elements, the second organic light-emitting elements, and the third organic light-emitting elements, and one or more fourth row banks are disposed on each of the auxiliary electrodes.

Further, according to another example of the display device, the display device further comprises: a plurality of third row banks disposed at spaced intervals in the column direction on the substrate in a third column region that, together with the second column region, sandwiches the third column bank; and a plurality of third organic light-emitting elements disposed on the substrate in the third column region between adjacent ones of the third row banks, emitting light in a color different from that of the first organic light-emitting elements and different from that of the second organic light-emitting elements, wherein the number of high row banks between adjacent ones of the second organic light-emitting elements is greater than the number of high row banks between adjacent ones of the first organic light-emitting elements, and is greater than the number of high row banks between adjacent ones of the third organic light-emitting elements, and a plurality of sets are disposed adjacent to each other on the substrate along a direction perpendicular to the column direction, each set consisting of the first column bank, the first organic light-emitting elements, the second column bank, the second organic light-emitting elements, the third column bank, and the third organic light-emitting elements.

Further, according to another example of the display device, the display device further comprises: a plurality of third row banks disposed at spaced intervals in the column direction on the substrate in a third column region that, together with the second column region, sandwiches the third column bank; and a plurality of third organic light-emitting elements disposed on the substrate in the third column region between adjacent ones of the third row banks, emitting light in a color different from that of the first organic light-emitting elements and different from that of the second organic light-emitting elements, wherein the number of high row banks between adjacent ones of the second organic light-emitting elements is greater than the number of high row banks between adjacent ones of the first organic light-emitting elements, and is greater than the number of high row banks between adjacent ones of the third organic light-emitting elements, and a plurality of sets are disposed at spaced intervals on the substrate along a direction perpendicular to the column direction, each set consisting of the first column bank, the first organic light-emitting elements, the second column bank, the second organic light-emitting elements, the third column bank, and the third organic light-emitting elements.

Further, according to another example of the display device, the display device further comprises: a fourth column bank disposed on the substrate spaced apart from the third column bank and elongated in the column direction; a plurality of third row banks disposed at spaced intervals in the column direction on the substrate in a third column region between the third column bank and the fourth column bank; a plurality of fourth row banks disposed at spaced intervals in the column direction on the substrate in a fourth column region that, together with the third column region, sandwiches the fourth column bank; a plurality of third organic light-emitting elements disposed on the substrate in the third column region between adjacent ones of the third row banks, emitting light in a color different from that of the first organic light-emitting elements and different from that of the second organic light-emitting elements; and a plurality of fourth organic light-emitting elements disposed on the substrate in the fourth column region between adjacent ones of the fourth row banks, emitting light in a color different from that of the first organic light-emitting elements, different from that of the second organic light-emitting elements, and different from that of the third organic light-emitting elements, wherein the number of high row banks between adjacent ones of the second organic light-emitting elements is greater than the number of high row banks between adjacent ones of the first organic light-emitting elements, and is greater than the number of high row banks between adjacent ones of the third organic light-emitting elements, the number of high row banks between adjacent ones of the fourth organic light-emitting elements is greater than the number of high row banks between adjacent ones of the first organic light-emitting elements, and is greater than the number of high row banks between adjacent ones of the third organic light-emitting elements, and a plurality of sets are disposed adjacent to each other on the substrate along a direction perpendicular to the column direction, each set consisting of the first column bank, the first organic light-emitting elements, the second column bank, the second organic light-emitting elements, the third column bank, the third organic light-emitting elements, the fourth column bank, and the fourth organic light-emitting elements.

Further, according to another example of the display device, all the second row banks and all the fourth row banks are high row banks, and all the first row banks and all the third row banks are low row banks.

Further, according to another example of the display device, each of the first organic light-emitting elements includes an organic light-emitting layer that contains a first organic light-emitting material, each of the second organic light-emitting elements includes an organic light-emitting layer that contains a second organic light-emitting material that is different from the first organic light-emitting material, and height from the top surface of the substrate to top surfaces of the organic light-emitting layers that contain the first organic light-emitting material or the second organic light-emitting material is higher than height from the top surface of the substrate to top surfaces of the low row banks and lower than height from the top surface of the substrate to top surfaces of the high row banks.

Further, a method of manufacturing a display panel according to one aspect of the present invention is a method comprising: preparing a substrate; forming, on the substrate: a first column bank, a second column bank, and a third column bank, each being elongated in a column direction; a plurality of first row banks disposed at spaced intervals in the column direction in a first column region between the first column bank and the second column bank; and a plurality of second row banks disposed at spaced intervals in the column direction in a second column region between the second column bank and the third column bank; applying a first ink containing a first organic light-emitting material between adjacent ones of the first row banks in the first column region on the substrate; applying second ink containing a second organic light-emitting material between adjacent ones of the second row banks in the second column region on the substrate, the second organic light-emitting material emitting a different color of light to the first organic light-emitting material; and forming a first organic light-emitting layer and a second organic light-emitting layer by drying the first ink and the second ink, wherein the first row banks and the second row banks collectively include low row banks that have a height from the substrate that is lower than that of the first column bank, the second column bank, and the third column bank, and high row banks that have a height from the substrate that is higher than that of the low row banks, and a number of high row banks between adjacent ones of the first organic light-emitting elements is different from a number of high row banks between adjacent ones of the second organic light-emitting elements.

According to the display panel described above, the number of high row banks disposed between the first organic light-emitting elements is different from the number of high row banks disposed between the second organic light-emitting elements. Thus, in a case in which high row banks and low row banks are mixed in the same column region, and low row banks are sandwiched between high row banks, with respect to organic light-emitting elements of light emission colors for which variation in film thickness of organic light-emitting layers has a large influence on variation in a property, the number of high row banks can be decreased, increasing a distance between high row banks (increasing the number of organic light-emitting elements between adjacent high row banks), to emphasize equalizing of ink quantities. On the other hand, with respect to organic light-emitting elements of light emission colors for which variation in a property is small, the distance between high row banks can be decreased (decreasing the number of organic light-emitting elements between adjacent high row banks), so that when a defective portion occurs in a column bank, suppressing spread of defective organic light-emitting elements due to the defective portion can be emphasized. Note that in the case of the most extreme difference between the number of high row banks between the first organic light-emitting elements and the number of high row banks between the second organic light-emitting elements, all of the row banks between one set of organic light-emitting elements becomes high row banks and all of the row banks between the other set of organic light-emitting elements becomes low row banks.

Accordingly, the present invention can provide a display panel that emphasizes suppression of variation in film thickness of organic functional layers for organic light-emitting elements that are greatly influenced by variation in film thickness of organic functional layers while suppressing spread of defective organic light-emitting elements due to defective portions for the display panel as a whole.

BRIEF DESCRIPTION OF THE DRAWINGS

These and other aims, advantages, and features of the present invention will become apparent from the following description taken in conjunction with the accompanying drawings, which illustrate at least one specific embodiment of the present invention.

FIG. 5A shows a partially cut-away perspective view of a process of forming a bank material film on a hole injection layer, and FIG. 5B shows a partially cut-away perspective view of a process of forming low row banks.

FIG. 6A shows a partially cut-away perspective view of a process of forming a bank material film on a hole injection layer and the low row banks, and FIG. 6B shows a partially cut-away perspective view of a process of forming high row banks and column banks.

FIG. 8A shows a display panel pertaining to a comparative example in which a second row bank is a low row bank, and FIG. 8B shows the display panel of FIG. 1.

FIG. 10A shows a display panel pertaining to a comparative example in which there are no gaps between unit sets, and FIG. 10B shows the display panel of FIG. 1.

FIG. 8A shows a display panel pertaining to a comparative example in which a fourth row bank is a low row bank, and FIG. 8B shows the display panel of FIG. 1.

DESCRIPTION OF EMBODIMENTS

Figure 1:
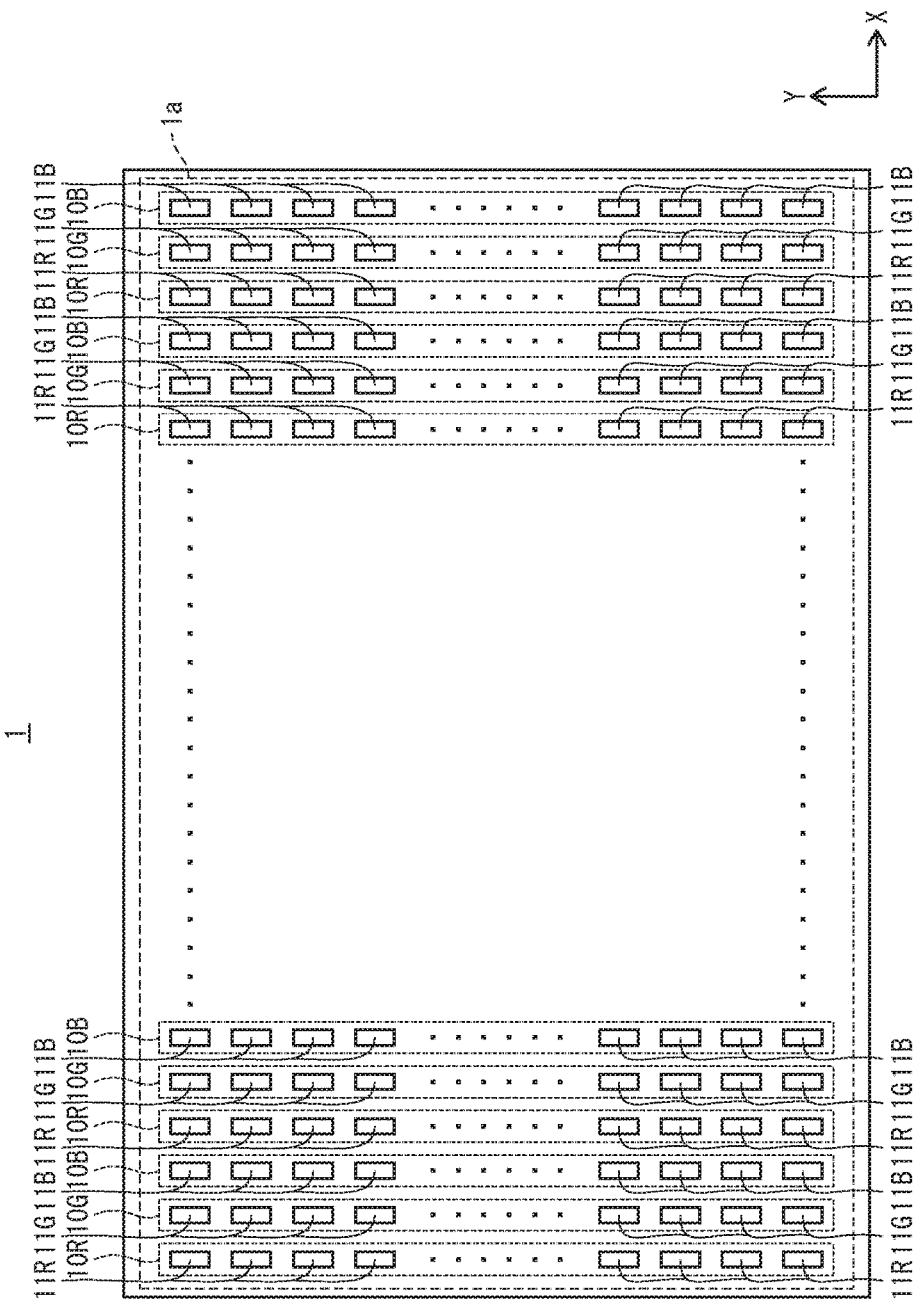
FIG. 1 shows a layout of organic light-emitting elements in a display panel pertaining to Embodiment 1 of the present invention.

The following describes embodiments of the present invention with reference to the drawings. In the drawings, a row direction is described as an X-axis direction and a column direction is described as a Y-axis direction.

Embodiment 1

1. Configuration of Display Panel 1
<Layout of Organic Light-Emitting Elements>

A layout of organic light-emitting elements in a display panel 1 pertaining to the present embodiment is described with reference to the layout in FIG. 1. FIG. 1 is a view of organic light-emitting elements as seen from above in a direction perpendicular to a main surface of the display panel 1.

The display panel 1 has a display region 1a that displays an image via light emission of organic light-emitting elements. In the display region 1a, for example, red organic light-emitting elements 11R that emit red (R) light (first organic light-emitting elements), green organic light-emitting elements 11G that emit green (G) light (second organic light-emitting elements), and blue organic light-emitting elements 11B that emit blue (B) light (third organic light-emitting elements) are arranged in a matrix in the X-axis direction and the Y-axis direction. The red organic light-emitting elements 11R, the green organic light-emitting elements 11G, and the blue organic light-emitting elements 11B (hereinafter referred to as "organic light-emitting elements 11" when there is no need for distinction) are disposed corresponding to sub pixels. A shape of each of the organic light-emitting elements 11 is, for example, rectangular.

Organic light-emitting elements 11 that are adjacent in the X-axis direction emit light of different colors from each other, and three organic light-emitting elements 11 that are adjacent in the X-axis direction form one pixel. For example, when the display panel 1 is made to a full high vision standard, the display panel 1 has pixels arranged in a matrix that has 1920 pixels in the X-axis direction and 1080 pixels in the Y-axis direction.

Organic light-emitting elements 11 that are adjacent in the Y-axis direction emit the same color of light. Blue organic light-emitting elements arranged in the Y-axis direction constitute an element column 10B, red organic light-emitting elements arranged in the Y-axis direction constitute an element column 10R, and green organic light-emitting elements arranged in the Y-axis direction constitute an element column 10G.

<Layout of Column Banks, Row Banks, Column Regions, and Organic Light-Emitting Elements>

Figure 2:
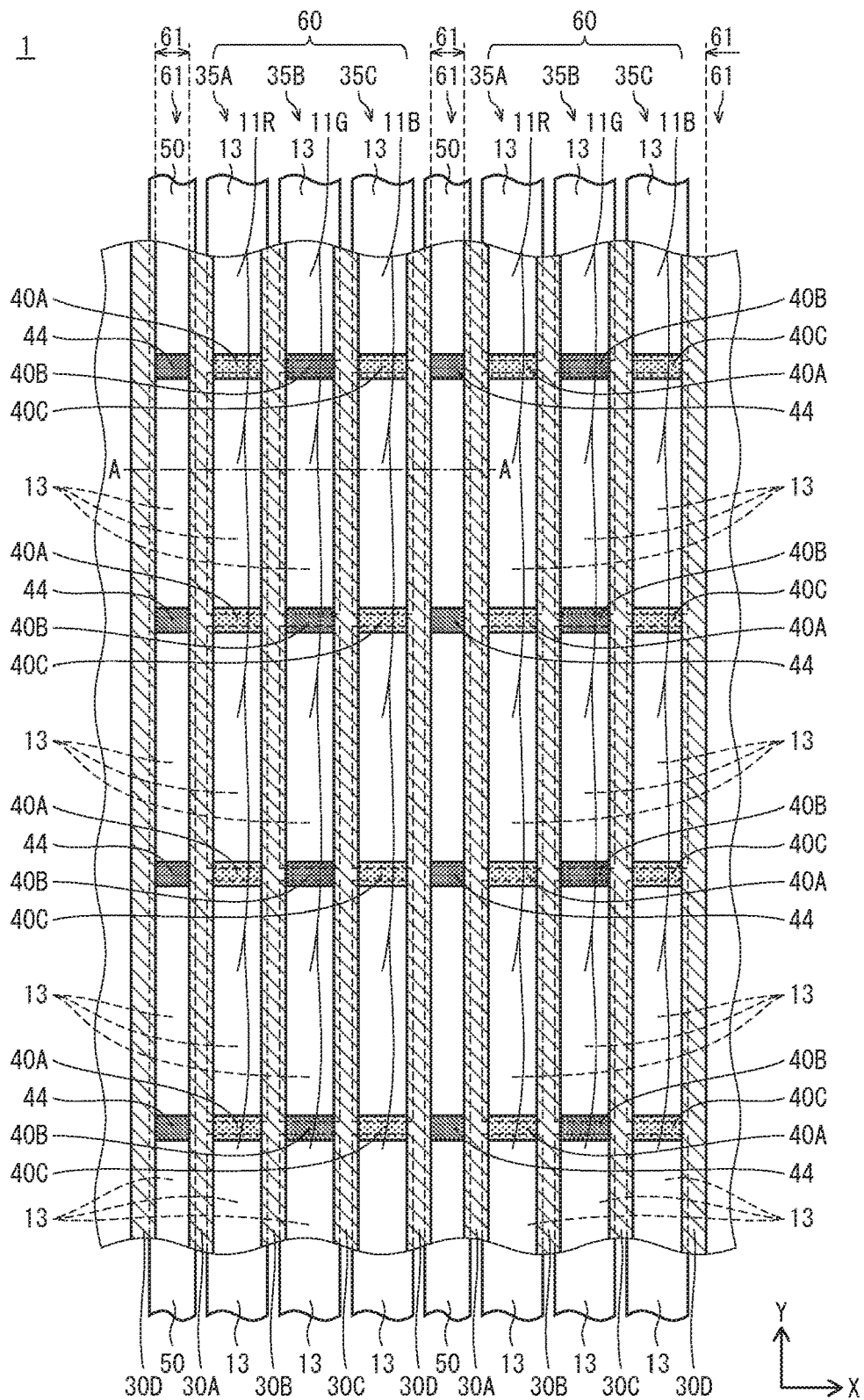
FIG. 2 shows a layout of column banks, row banks, and organic light-emitting elements in the display panel of FIG. 1.

The following describes a layout of column banks, row banks, and organic light-emitting elements in the display panel 1, with reference to the layout in FIG. 2. In FIG. 2, as an example, in the display panel 1, 18 of the organic light-emitting elements 11 and a surrounding area are shown in an enlarged view. In the display panel 1, column banks, row banks, and organic light-emitting elements not shown in FIG. 2 are similarly arranged to those shown.

In the display panel 1, sets 60 are spaced in the X-axis direction with gaps 61 therebetween. Each of the sets 60 consists of red organic light-emitting elements 11R, green organic light-emitting elements 11G, blue organic light-emitting elements 11B, a first column bank 30A, a second column bank 30B, a third column bank 30C, and a fourth column bank 30D (hereinafter referred to as "column banks 30" when there is no need for distinction).

The first column bank 30A, the second column bank 30B, the third column bank 30C, and the fourth column bank 30D each extend in the Y-axis direction and have an elongated shape. In a first column region 35A between the first column bank 30A and the second column bank 30B, a plurality of first row banks 40A are spaced at intervals in a longitudinal direction, and the red organic light-emitting elements 11R are disposed between adjacent ones of the first row banks 40A. Here, "longitudinal direction" means a longitudinal direction of the column banks 30 (hereinafter referred to as "column direction"). Further, in a second column region 35B between the second column bank 30B and the third column bank 30C, a plurality of second row banks 40B are spaced at intervals in the column direction, and the green organic light-emitting elements 11G are disposed between adjacent ones of the second row banks 40B. Furthermore, in a third column region 35C between the third column bank 30C and the fourth column bank 30D, a plurality of third row banks 40C are spaced at intervals in the column direction, and the blue organic light-emitting elements 11B are disposed between adjacent ones of the third row banks 40C. In addition, a plurality of fourth row banks 44 are spaced at intervals in the column direction in the gaps 61.

<Cross-Section of Display Panel 1>

Figure 3:
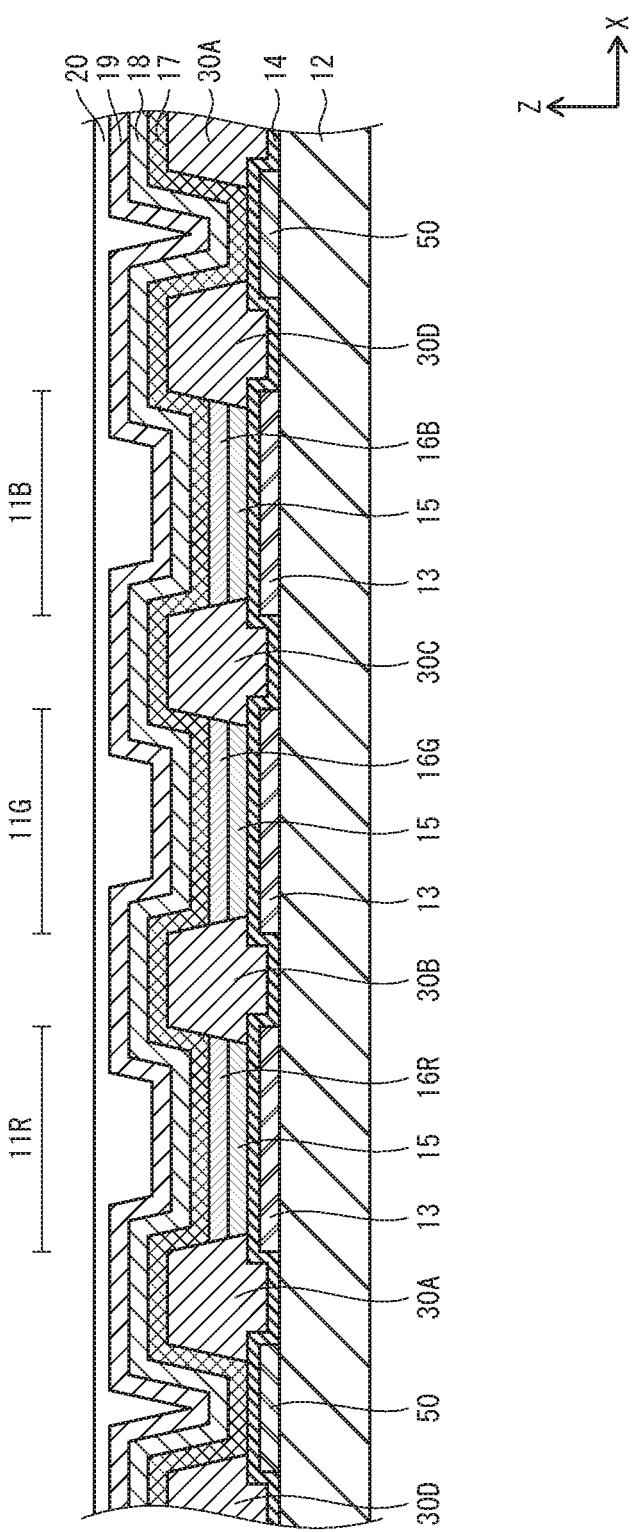
FIG. 3 is a schematic cross-section showing configuration of organic light-emitting elements that are adjacent in an X-axis direction in the display panel of FIG. 1.

A cross-section configuration of the display panel 1 is described with reference to the schematic cross-section of FIG. 3. FIG. 3 is a cross-section of A-A in FIG. 2, showing one of the red organic light-emitting elements 11R, one of the green organic light-emitting elements 11G, and one of the blue organic light-emitting elements 11B, which are adjacent in the X-axis direction and form one pixel, and their surroundings.

In addition to the first row banks 40A, the second row banks 40B, the third row banks 40C, the fourth row banks 44 (hereinafter referred to as "row banks 40" when there is no need for distinction), and the column banks 30, the display panel 1 includes a substrate 12, lower electrodes 13, auxiliary electrodes 50, a hole injection layer 14, hole transport layers 15, red organic light-emitting layers 16R, green organic light-emitting layers 16G, blue organic light-emitting layers 16B (hereinafter referred to as "organic light-emitting layers 16" when there is no need for distinction), an electron transport layer 17, an electron injection layer 18, an upper electrode 19, and a sealing layer 20. The organic light-emitting elements 11 include portions of the lower electrodes 13 and the upper electrode 19 covering the organic light-emitting layers 16, and layers therebetween. The display panel 1, according to the present embodiment, is a top-emission type of display panel. Thus, in FIG. 3, light is emitted upwards in a Z-axis direction. The following describes components of the display panel 1.

2. Components of the Display Panel 1
<Substrate>

The substrate 12 is, for example, formed by stacking a TFT layer and an interlayer insulating layer in this order on a glass substrate. As a material of the glass substrate, a material such as soda lime glass or alkali-free glass can be used, for example.

The TFT layer includes a plurality of transistor elements for each sub pixel. Each of the transistor elements includes three electrodes: gate, source, and drain, a semiconductor layer, and a passivation layer. As a material of the interlayer insulating layer, a material such as polyimide, polyamide, or acrylic resin can be used.

<Lower Electrodes>

The lower electrodes 13 are electrically connected to the TFT layers in the substrate 12, and function as anodes. Returning to FIG. 2, the lower electrodes 13 are disposed at spaced intervals in the X-axis direction and spaced intervals in the Y-axis direction. Each of the lower electrodes 13 is rectangular. Ends of the lower electrodes 13 in the X-axis direction are covered by the column banks 30. Ends of the lower electrodes 13 in the Y-axis direction are covered by the first row banks 40A, the second row banks 40B, or the third row banks 40C. As a material of the lower electrodes 13, a material such as a metal material including silver (Ag) or aluminium (Al) may be used. The display panel 1 is a top-emission type, and therefore a surface of the lower electrodes 13 preferably has high light reflectivity. Thickness of the lower electrodes 13 is from 100 nm to 700 nm, for example.

<Auxiliary Electrodes>

The auxiliary electrodes 50 are connected to the upper electrode 19 and are provided to suppress voltage drop in the upper electrode 19. The auxiliary electrodes 50 are disposed in the gaps 61 of the sets 60, i.e., in gaps between the first column bank 30A and the fourth column bank 30D. The auxiliary electrodes 50 have an elongated shape extending in the Y-axis direction. A plurality of the fourth row banks 44 are disposed on the auxiliary electrodes 50. Ends of the auxiliary electrodes 50 in the X-axis direction are covered by the first column bank 30A and the fourth column bank 30D. As a material of the auxiliary electrodes 50, a material such as a metal material including silver (Ag) or aluminium (Al) may be used, similarly to the material of the lower electrodes 13. Thickness of the auxiliary electrodes 50 is from 100 nm to 700 nm, for example, similarly to the thickness of the lower electrodes 13.

<Hole Injection Layer>

Returning to FIG. 3, the hole injection layer 14 is disposed on the lower electrodes 13 and on portions of the substrate 12 corresponding to gaps between adjacent ones of the lower electrodes 13. The hole injection layer 14 has a function of improving hole injectability from the lower electrodes 13 to the light-emitting layers 16. As a material of the hole injection layer 14, an inorganic material such as a metal oxide can be used. As a metal oxide, an oxide of a metal such as silver (Ag), molybdenum (Mo), chromium (Cr), vanadium (V), tungsten (W), nickel (Ni), or iridium (Ir) can be used. Thickness of the hole injection layer 14 is from 5 nm to 30 nm, for example.

<Hole Transport Layers>

The hole transport layers 15 are disposed on the hole injection layer 14. The hole transport layers 15 have a function of transporting holes injected from the lower electrodes 13 to the organic light-emitting layers 16. A material of the hole transport layers 15 is an organic material. As an organic material, for example, a polymer compound that has no hydrophilic group can be used, such as polyfluorene, a derivative thereof, polyarylamine, or a derivative thereof. Thickness of the hole injection layers 15 is from 5 nm to 30 nm, for example.

<Organic Light-Emitting Layers>

The organic light-emitting layers 16 are disposed on the hole injection layers 15. Although not shown, the organic light-emitting layers 16 are partitioned by the column banks 40. The organic light-emitting layers 16 have a function of emitting light generated by an excited state due to recombination of holes and electrons injected thereto. The red organic light-emitting layers 16R include a red organic light-emitting material. Similarly, the green organic light-emitting layers 16G include a green organic light-emitting material, and the blue organic light-emitting layers 16B include a blue organic light-emitting material. As an organic light-emitting material, an oxinoid compound, a perylene compound, a coumarin compound, an azacoumarin compound or the like can be used. Thicknesses of the organic light-emitting layers 16 are from 50 nm to 150 nm, for example.

<Electron Transport Layer>

The electron transport layer 17 is disposed across the organic light-emitting layers 16, the column banks 30, and the row banks 40. The electron transport layer 17 has a function of transporting electrons injected from the upper electrode 19 to the organic light-emitting layers 16. As a material of the electron transport layer 17, an oxadiazole derivative (OXD), a triazole derivative (TAZ), a phenanthroline derivative (BCP, Bphen), or the like can be used. Thickness of the electron transport layer 17 is from 5 nm to 80 nm, for example.

<Electron Injection Layer>

The electron injection layer 18 is disposed on the electron transport layer 17. The hole injection layer 18 has a function of improving electron injectability from the upper electrode 19 to the organic light-emitting layers 16. As a material of the electron injection layer, a metal complex including an alkali metal can be used, for example. Thickness of the electron injection layer 18 is from 5 nm to 80 nm, for example.

<Upper Electrode>

The upper electrode 19 is disposed above the column banks 30 and on the electron transport layer 17. Further, although not shown, the upper electrode 19 is disposed on the row banks 40. The upper electrode 19 functions as a cathode. As a material of the upper electrode 19, indium tin oxide (ITO), indium zinc oxide (IZO), magnesium-silver alloy (MgAg) or the like can be used, for example. The display panel 1 is a top-emission type, and therefore material of the upper electrode 19 is preferably light-transmissive. In the case of using indium tin oxide (ITO), thickness of the upper electrode 19 is from 30 nm to 200 nm, for example. Further, in the case of using magnesium-silver alloy (MgAg), thickness of the upper electrode 19 is from 10 nm to 50 nm, for example.

<Sealing Layer>

The sealing layer 20 is disposed on the upper electrode 19. The sealing layer 20 has a function of suppressing exposure of layers to moisture and air. As a material of the sealing layer 20, silicon nitride (SiN) can be used, for example.

<Banks>

The column banks 30 are disposed on the hole injection layer 14, and cover portions between the lower electrodes 13 in the X-axis direction and ends of the lower electrodes 13 in the X-axis direction.

In the case of forming the organic light-emitting layers 16 by a printing method, for example, height of the column banks 30 is set so that the column banks 30 can block flow of applied organic material ink, i.e., a height at which organic material ink cannot flow over the column banks 30, such as from 1.0 μm to 1.5 μm. Here, height of the column banks 30 means "height from a top surface of the substrate 12 to a top surface of the column banks 30". The same is true for height of the column banks 40. As a material of the column banks 30, an acrylic resin type of positive photoresist can be used.

The first row banks 40A, the second row banks 40B, and the third row banks 40C are not shown in the cross-section in FIG. 3, but are disposed on the hole injection layer 14 and cover portions between the lower electrodes 13 in the Y-axis direction and ends of the lower electrodes 13 in the Y-axis direction. The fourth row banks 44 are not shown in the cross-section in FIG. 3, but are disposed on the hole injection layer 14 and partially cover the auxiliary electrodes 50.

Figure 4:
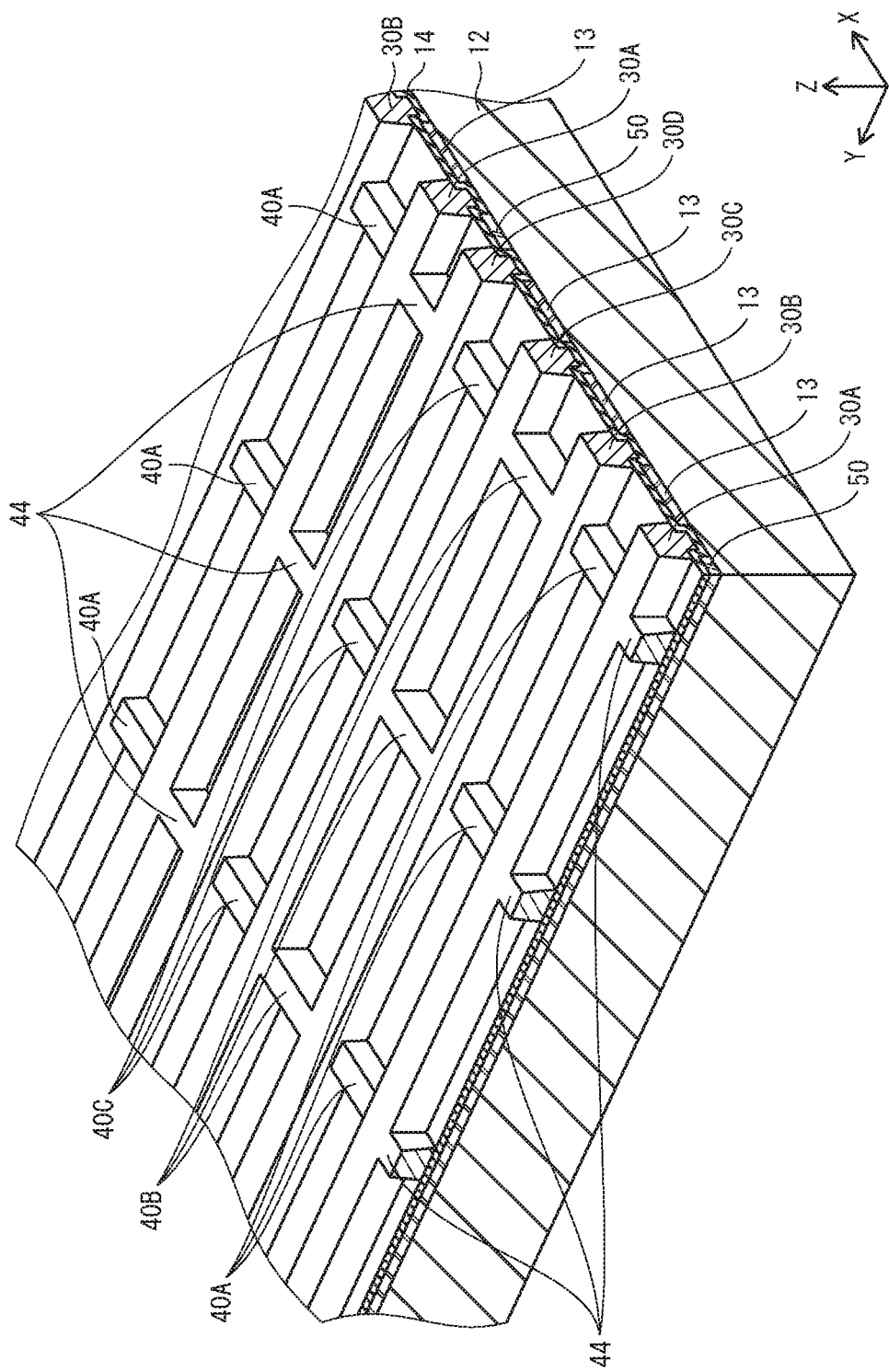
FIG. 4 is a partially cut-away perspective view of the display panel of FIG. 1 in which layers above the column banks and row banks are removed.

FIG. 4 shows a perspective view of structure of the column banks 30 and the row banks 40. For convenience, FIG. 4 is shown with layers above the column banks 30 and the row banks 40 removed. The row banks 40 include low row banks that are lower than the column banks 30 and high row banks that are higher than the low row banks. All of the first row banks 40A (1079 of them in the case of a full high vision standard) and all of the third row banks 40C (1079 of them in the case of a full high vision standard) are low row banks. Thus, the number of high row banks between adjacent ones of the blue organic light-emitting elements 11B and between adjacent ones of the red organic light-emitting 10R is zero. In the case of forming the organic light-emitting layers 16 by a printing method, height of the low row banks is greater than a total thickness of one of the lower electrodes 13 and the hole injection layer 14, allows organic material ink that is applied to flow over the low row banks, and is from 105 nm to 500 nm, for example. All of the second row banks 40B (1079 of them in the case of a full high vision standard) and all of the fourth row banks 44 (1079 of them in the case of a full high vision standard) are high row banks. All of the fourth row banks 44 on the auxiliary electrodes 50 in the gaps 61 (1079 of them in the case of a full high vision standard) are high row banks. In the case of forming the organic light-emitting layers 16 by a printing method, height of the high row banks is sufficient to block flow of organic material ink that is applied, i.e., is a height that does not allow the organic material ink to flow over the high row banks, and is from 1.0 μm to 1.5 μm, for example. Note that height of high row banks may be set with an intent of holding some extent of organic material ink applied between the high row banks. According to the present embodiment, height of the high row banks is equal to height of the column banks 30. In FIG. 2, low row banks are marked by coarse dot patterning and high row banks are marked by fine dot patterning. As a material of the row banks 40, an acrylic resin type positive photoresist can be used, as with the material of the column banks 30.

3. Display Panel 1 Manufacturing Method

As described above, the present embodiment is characterized by the structure of banks. The following describes a method of manufacturing the display panel 1 and in particular processes of forming banks and organic light-emitting layers, mainly with reference to partially cut-away perspective views of FIG. 5A to FIG. 7.

Figure 5A:
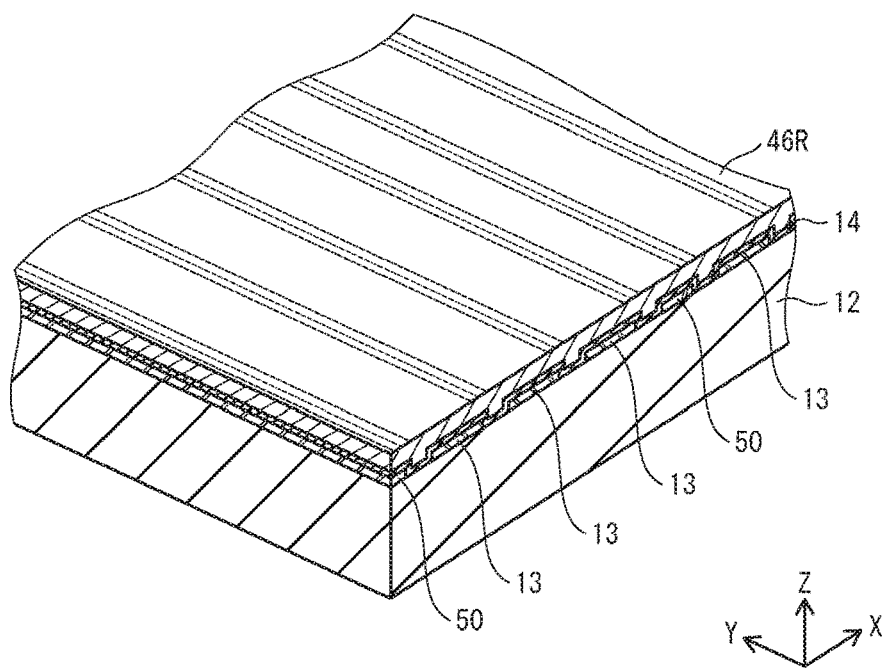
FIG. 5A and FIG. 5B are for describing a method of manufacturing the display panel of FIG. 1.

As shown in FIG. 5A, after forming the hole injection layer 14 on the substrate 12 on which the lower electrodes 13 and the auxiliary electrode 50 are formed, a bank material film 46R is formed on an entire surface of the hole injection layer 14. The substrate 12 is formed by forming a TFT layer and an interlayer insulating layer on a top surface of a glass substrate, and is manufactured by a known technique. The lower electrodes 13 and the auxiliary electrodes 50 are formed by depositing a metal film on the substrate 12 by using sputtering or vacuum deposition, and then patterning the metal film. Further, a metal oxide film is formed on the substrate 12 on which the lower electrode 13 and the auxiliary electrode 50 are formed by using sputtering or vacuum deposition, thereby forming the hole injection layer 14. The bank material film 46R is formed by applying an acrylic resin type positive photoresist in a liquid state by using an application method such as spin coating.

Figure 5B:
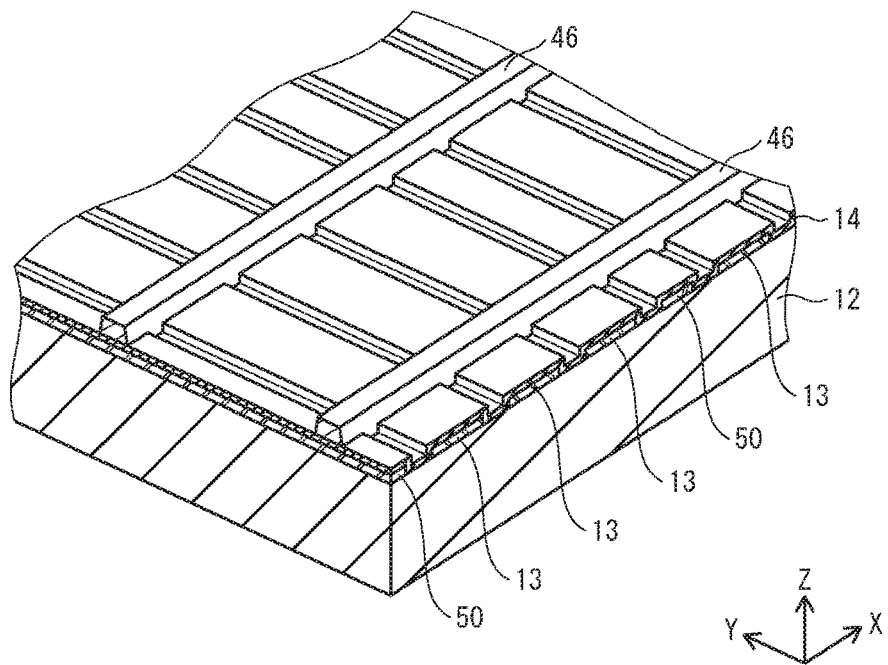

Subsequently, as shown in FIG. 5B, a row bank first layer 46 is formed. The row bank first layer 46 is formed by patterning the bank material film 46R by light exposure and developing, then baking. More specifically, light exposure involves UV irradiation processing through a mask, hardening a portion of the bank material film 46R. Developing involves removing unhardened bank material film with a developer.

Figure 6A:
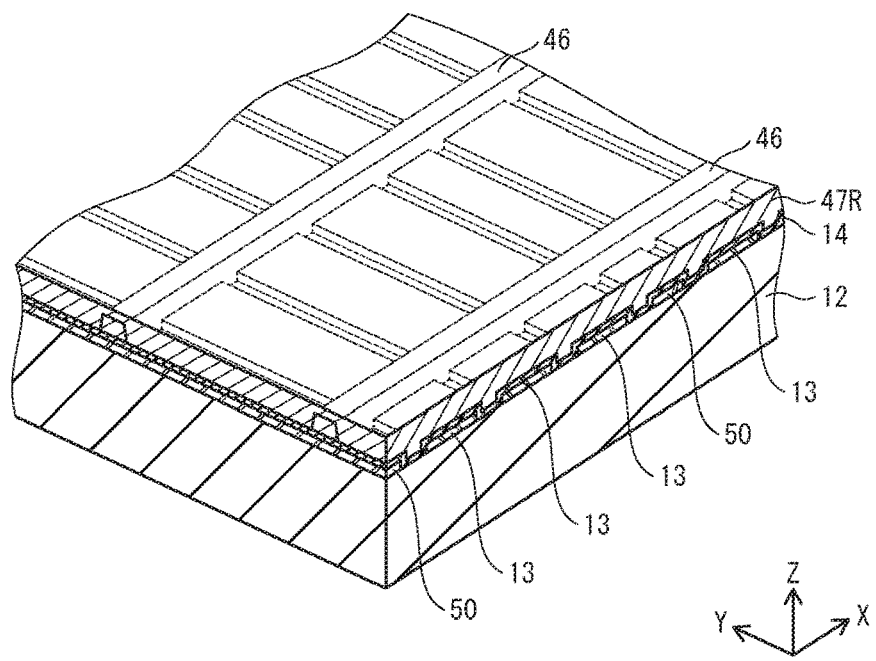
FIG. 6A and FIG. 6B are for describing a method of manufacturing the display panel of FIG. 1.

As shown in FIG. 6A, a bank material film 47R is formed on an entire surface of the hole injection layer 14 on which the row bank first layer 46 is formed. The bank material film 47R is formed by applying an acrylic resin type positive photoresist in a liquid state by using an application method such as spin coating, as with the bank material film 46R.

Figure 6B:
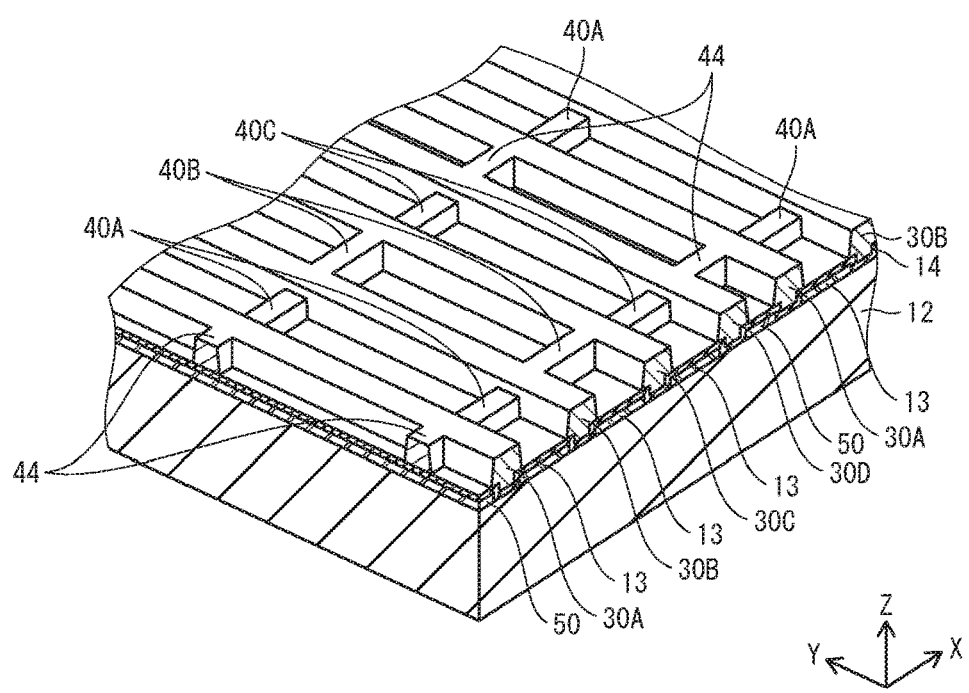

Further, as shown in FIG. 6B, the column banks 30 and the row banks 40 are formed. The column banks 30, the second row banks 40B, and the fourth row banks 44 are formed by patterning the bank material film 47R by light exposure and developing, then baking. More specifically, light exposure involves UV irradiation processing through a mask, hardening a portion of the bank material film 47R. Developing involves removing unhardened bank material film with a developer.

In forming the column banks 30 and the row banks 40, forming the first row banks 40A and the third row banks 40C, which are low row banks, is one process, and forming column banks 30, which have the same height as the second row banks 40B and the fourth row banks 44, which are high row banks, is one process. Thus, the second row banks 40B and the fourth row banks 44 are integrally formed of a layer formed of the bank material film 46R and a layer formed of the bank material film 47R.

Figure 7:
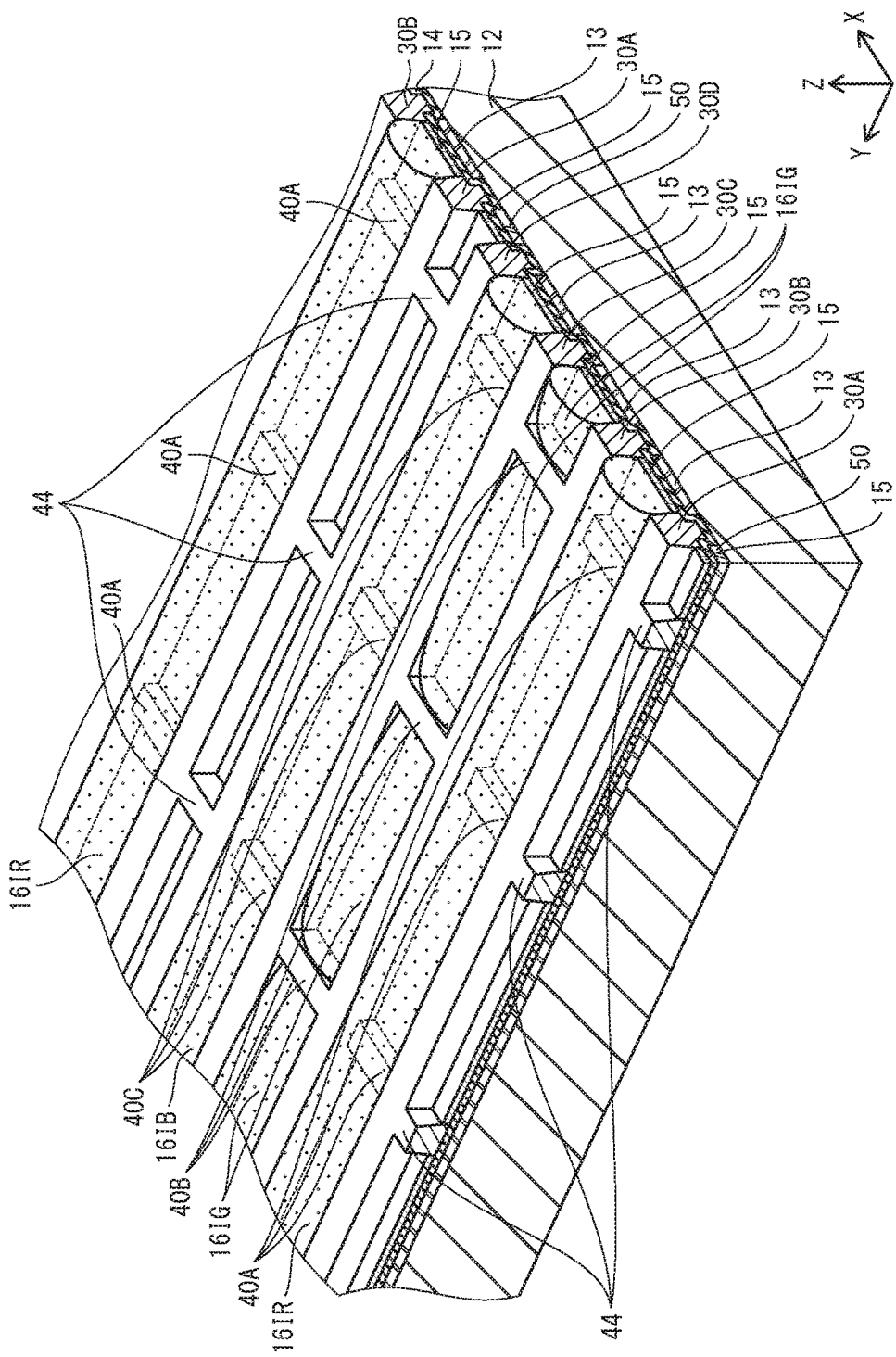
FIG. 7 is for describing a method of manufacturing the display panel of FIG. 1, and shows a partially cut-away perspective view of a process of applying ink.

As shown in FIG. 7, with respect to sub pixel regions, which are regions partitioned by adjacent ones of the column banks 30 and adjacent ones of the row banks 40, after forming the hole transport layers 15, red organic material ink 16IR, green organic material ink 16IG, and blue organic material ink 16IB are applied. More specifically, the hole transport layers 15 are formed by applying material of the hole transport layers 15 in an ink state to sub pixel regions by using a printing method, then drying the ink. Subsequently, the red organic material ink 16IR, the green organic material ink 16IG, and the blue organic material ink 16IB are applied to sub pixel regions.

The red organic material ink 16IR and the green organic material ink 16IG that are adjacent in the X-axis direction are separated by the second column banks 30B. The green organic material ink 16IG and the blue organic material ink 16IB that are adjacent in the X-axis direction are similarly separated.

The green organic material ink 16IG is partitioned in the Y-axis direction by the second row banks 40B. Since the second row banks 40B are high row banks, the green organic material ink 16IG applied to the sub pixels adjacent to each other in the Y-axis direction does not cross the second row banks 40B and does not become connected.

On the other hand, since the first row banks 40A are low row banks, the red organic material ink 16IR applied to the sub pixels regions adjacent to each other in the Y-axis direction does cross and connect over the first row banks 40A. As a result, volume of the red organic material ink 16IR in the Y-axis direction becomes equalized. Thus, variation in film thicknesses of the red organic light-emitting layers 16R that are adjacent to each other in the Y-axis direction can be suppressed. According to the present embodiment, the first row banks 40A are all low row banks. Accordingly, the red organic material ink 16IR applied to all sub pixels aligned in the Y-axis direction is connected, and therefore variation in film thicknesses of the red organic light-emitting layers 16R that are adjacent to each other in the Y-axis direction can be suppressed. Similarly, the third row banks 40C are all low row banks, and therefore the blue organic material ink 16IB applied to all sub pixels regions aligned in the Y-axis direction is connected, and therefore variation in film thicknesses of the blue organic light-emitting layers 16B that are adjacent to each other in the Y-axis direction can be suppressed.

Subsequently, the organic light-emitting layers 16 are formed by drying the red organic material ink 16IR, the green organic material ink 16IG, and the blue organic material ink 16IB, then the hole transport layer 17, the hole injection layer 18, the upper electrode 19, and the sealing layer 20 are stacked in this order to complete the display panel 1. More specifically, first, the electron transport layer 17 is formed by using vapor deposition. Subsequently, the upper electrode 19 is formed by using vapor deposition or sputtering to cover top surfaces of the electron transport layer 17, the column banks 30, and the row banks 40, and the sealing layer 110 is formed by using CVD or sputtering.

4. Effects

<Effects of High Row Banks>

Figure 8A:
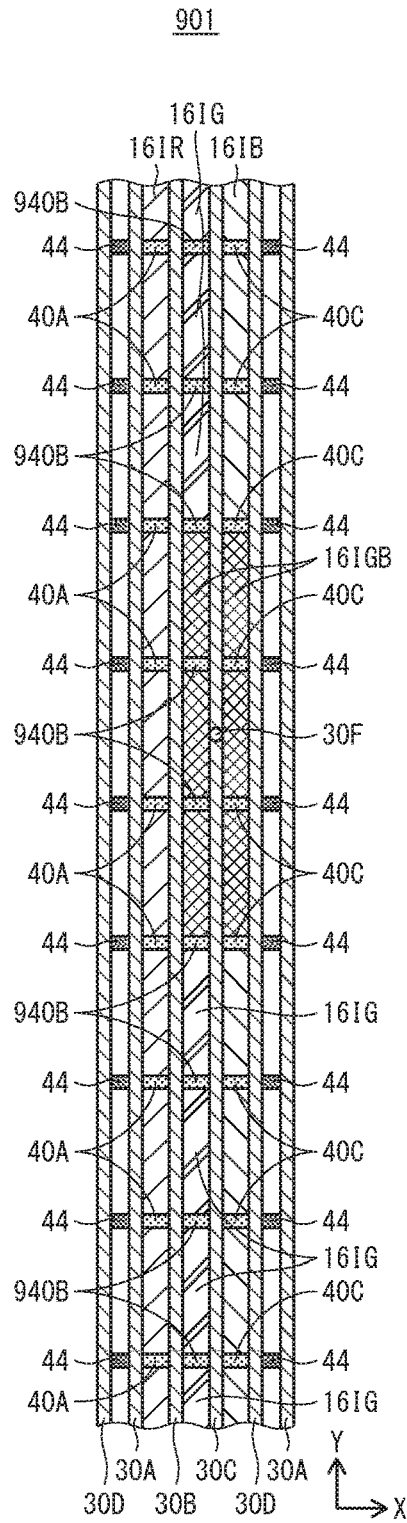
FIG. 8A and FIG. 8B are plan views immediately after ink is applied in a method of manufacturing a display panel when a defective portion is present in a second column bank.
Figure 8B:
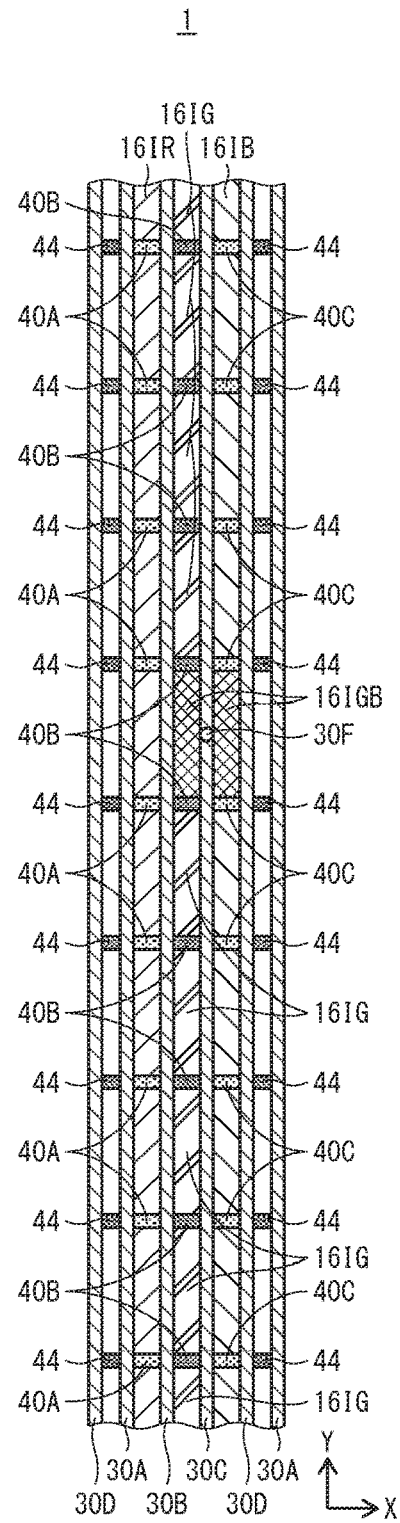

Functions of the high row banks are examined with reference to FIG. 8A and FIG. 8B. These drawings show the display panel 1 in which a defective portion 30F is present in one of the third column banks 30C, in plan view immediately after applying organic material ink. According to the defective portion 30F, due to an unintentionally missing part of the third column bank 30C, for example, defective display occurs across three sub pixel regions on either side. The following describes a display panel 901 pertaining to a comparative example. The display panel 901 pertaining to the comparative example has the same configuration as the display panel 1 pertaining to Embodiment 1, except that second row banks 940B are low row banks.

As shown in FIG. 8A, the defective portion 30F is present in the third column bank 30C in the display panel 901. Consequently, the blue organic material ink 16IB enters into a sub pixel region adjacent to the defective portion 30F in which the green organic material ink 16IG is applied. Further, the blue organic material ink 16IB overflows second row banks 940B one by one from the sub pixel region previously entered in directions "up" and "down" the page in FIG. 8A. Similarly, the green organic material ink 16IG enters into a sub pixel region adjacent to the defective portion 30F in which the blue organic material ink 16IB is applied, and overflows third row banks 40C one by one in directions "up" and "down" the page in FIG. 8A. Thus, mixed color ink 16IGB becomes present in sub pixel regions adjacent to the defective portion 30F, and in sub pixel region adjacent to these sub pixel regions, for a total of six sub pixel regions. When the mixed color ink 16IGB is dried to become organic light-emitting layers, six defective organic light-emitting elements occur in the display panel 901. Note that ink entering via the defective portion 30F may overflow two or more third row banks 40C "up" and "down" the page in FIG. 8A from the sub pixel initially entered. In this case, eight or more defective organic light-emitting elements may occur, increasing the effect of display errors on a display panel.

On the other hand, as shown in FIG. 8B, the defective portion 30F is also present in the third column bank 30C in the display panel 1. The blue organic material ink 16IB enters into a sub pixel region adjacent to the defective portion 30F in which the green organic material ink 16IG is applied, but is blocked by second row banks 40B. Although the green organic material ink 16IG enters into a sub pixel region adjacent to the defective portion 30F in which the blue organic material ink 16IB is applied, it is difficult to overflow third row banks 40C one by one in directions "up" and "down" the page in FIG. 8B. Further, even if the green organic material ink 16IG that enters via the defective portion 30F overflows third row banks 40C "up" and "down" the page in FIG. 8B from the sub pixel initially entered, influence of this overflow is very small. Based on the above, mixed color ink 16IGB becomes present in two sub pixel regions adjacent to the defective portion 30F. When the mixed color ink 16IGB is dried to become organic light-emitting layers, two defective organic light-emitting elements occur in the display panel 1.

Thus, even when the defective portion 30F is present, the display panel 1, compared with the display panel 901, suppresses spread of organic light-emitting elements in which display errors occur from organic light-emitting elements adjacent to the defective portion 30F to other organic light-emitting elements adjacent in the column direction. In other words, the display panel 1 can suppress spread of defective organic light-emitting elements due to the defective portion 30F.

Further, according to the display panel 1, on both sides of the second column region containing high row banks are the first column region and the third column region, containing low row banks, and therefore in comparison to a configuration in which column regions containing low row banks are adjacent to each other, spread of defective organic light-emitting elements is suppressed.

<Arrangement of High Row Banks>

As described above, according to the display panel 1, all of the second row banks 40B disposed between adjacent ones of the green organic light-emitting elements 11G are high row banks, and all of the first row banks 40A disposed between adjacent ones of the red organic light-emitting elements 11R and all of the third row banks 40C disposed between adjacent ones of the blue organic light-emitting elements 11B are low row banks. That is, the number of high row banks provided between adjacent ones of the green organic light-emitting elements 11G is greater than the number of high row banks provided between adjacent ones of the red organic light-emitting elements 11R and greater than the number of high row banks provided between adjacent ones of the blue organic light-emitting elements 11B.

The reason why high row banks are disposed between adjacent ones of the green organic light-emitting elements 11G is that even if film thickness variation of organic light-emitting layers is approximately the same for red organic light-emitting elements, green organic light-emitting elements, and blue organic light-emitting elements, degrees of variation in properties of the organic light-emitting elements are different. The following illustrates and describes this variation in properties as variation in brightness.

Figure 9:
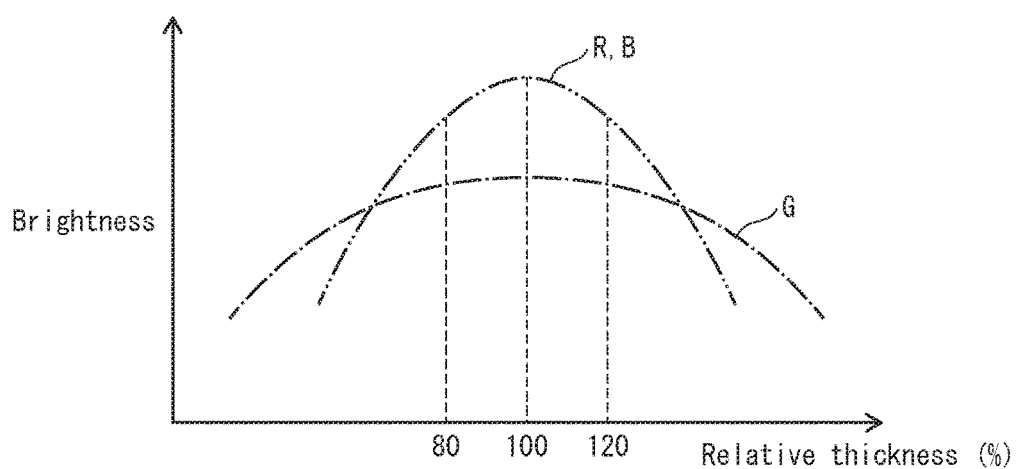
FIG. 9 is a graph for describing properties of an organic light-emitting material included in an organic light-emitting layer in the display panel of FIG. 1.

FIG. 9 shows a schematic graph for describing properties of organic light-emitting material, in which the horizontal axis indicates relative thickness (%) of organic light-emitting layers composed of organic light-emitting material and the vertical axis indicates brightness of the organic light-emitting layers when an identical voltage is applied. Here, "relative thickness of organic light-emitting layers" means a relative thickness of organic light-emitting layers when a target film thickness of organic light-emitting layers is 100%. The dot-dash line indicates properties of green organic light-emitting material, and the two-dot-dash line indicates properties of red and blue organic light-emitting material. According to the present embodiment, film thickness is set to a target setting to optimize brightness, but this is not a limitation and a target setting may be set to optimize lifetime or power consumption.

According to the green organic light-emitting material, brightness does not change much even if thickness is changed. Thus, even if variation in film thickness of green organic light-emitting layers occurs, an effect on brightness variation will be small. In contrast, according to red organic light-emitting material and blue organic light-emitting material, brightness changes greatly when thickness is changed. Thus, when variation in film thickness of red organic light-emitting layers and blue organic light-emitting layers occurs, an effect on brightness variation will be large. Thus, because influence of thickness on brightness is less for the green organic light-emitting material than the red organic light-emitting material and the blue organic light-emitting material, it can be said that the effect on brightness would be small even if variation in film thickness between adjacent ones of the green organic light-emitting layers in the Y-axis direction were increased by a high number of high row banks in the second row banks. According to the present embodiment, the red organic light-emitting layers, the green organic light-emitting layers, and the blue organic light-emitting layers are aligned in the X-axis direction, and therefore influence of film thickness on brightness is considered important. Results of this are described later. Note that even when the green organic light-emitting layers, the red organic light-emitting layers, and the blue organic light-emitting layers are aligned in the X-axis direction, an effect can be obtained of suppressing spread of defective organic light-emitting elements due to a defective portion.

On the other hand, according to the present embodiment, the green organic light-emitting material is the organic light-emitting material for which the influence of film thickness on brightness is small, but this is not a limitation and according to a combination of RGB organic light-emitting materials, influence of film thickness on brightness may be small for red or blue organic light-emitting material. In such a case, a column region into which organic material ink containing red organic light-emitting material or blue organic light-emitting material is applied may have a high number of high row banks. For example, when film thickness of red organic light-emitting material has a small influence on brightness, high row banks may be provided between adjacent ones of the red organic light-emitting layers, and low row banks may be provided between adjacent ones of the green organic light-emitting layers and adjacent ones of the blue organic light-emitting layers. In this case, the red organic light-emitting layers, the green organic light-emitting layers, and the blue organic light-emitting layers may be arranged in this order in the X-axis direction. Further, when the green organic light-emitting layers, the red organic light-emitting layers, and the blue organic light-emitting layers are arranged in this order in the X-axis direction, the effect of suppressing spread of defective organic light-emitting elements due to a defective portion can be increased.

When high row banks and low row banks coexist in one column region, a different effect is obtained when there are many high row banks and when there are few high row banks. More specifically, as the number of low row banks sandwiched between high row banks increases, the configuration becomes better at equalizing amounts of ink. On the other hand, as the number of low row banks sandwiched between high row banks decreases, the configuration becomes better at suppressing spread of defective organic light-emitting elements due to a defective portion occurring. The number of high row banks can be selected according to the magnitude of influence of film thickness on brightness for organic material ink applied to the column region.

According to the present embodiment, as described above, with respect to equalizing ink amounts and suppressing spread of defective organic light-emitting elements due to a defective portion, the latter is considered important for a green light-emitting material for which film thickness variation has a small influence on brightness variation, and the former is considered important for blue light-emitting material and red light-emitting material for which film thickness variation has a large influence on brightness variation. Thus, with respect to the red organic light-emitting elements 11R and the blue organic light-emitting elements 11B for which brightness is greatly influenced by variation in film thickness of organic light-emitting layers, variation in properties of organic light-emitting elements due to variation in film thickness of organic light-emitting layers is considered important, and with respect to the green organic light-emitting elements 11G for which influence of variation in film thickness of organic light-emitting layers is small, spread of defective organic light-emitting elements due to a defective portion is suppressed. Note that this is not limited to organic light-emitting layers, and other layers that are organic functional layers such as a hole injection layer, hole transport layers, an electron injection layer, and an electron transport layer are also preferably taken into consideration. For example, in a case in which organic functional layers consist of organic light-emitting layers and hole transport layers, which are formed by ink application, in addition to the influence of film thickness variation on the organic light-emitting layers, influence of film thickness variation on the hole transport layers is preferably also considered when designing a display panel.

<Set Intervals>

As described above, according to the present embodiment, the sets 60 comprising the organic light-emitting elements 11 and the column banks 30 are spaced in the X-axis direction with the gaps 61 therebetween. The sets 60 and the gaps 61 are examined with reference to FIG. 10A and FIG. 10B. These drawings show the display panel 1 in which a defective portion 30F is present in one of the first column banks 30A, in plan view immediately after applying organic material ink. The defective portion 30F is, for example, an unintentionally missing portion of one of the first column banks 30A, here making it unable to block flow of ink. The following describes a display panel 911 pertaining to a comparative example. The display panel 911 pertaining to the comparative example has the same configuration as the display panel 1 pertaining to Embodiment 1, except that no gap is provided between sets.

Figure 10A:
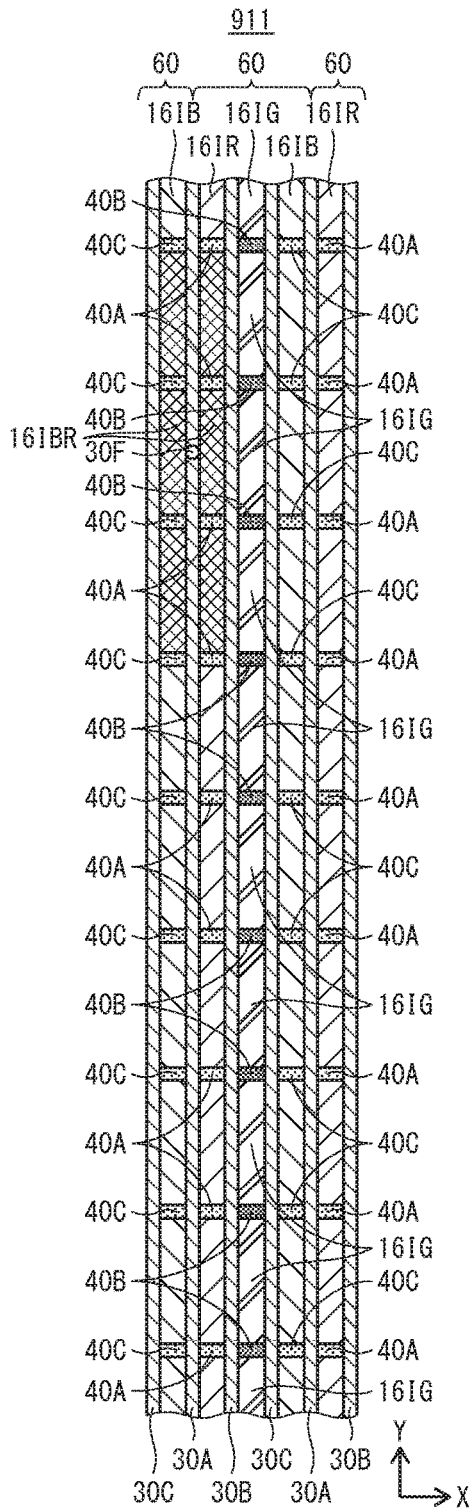
FIG. 10A and FIG. 10B are plan views immediately after ink is applied in a method of manufacturing a display panel when a defective portion is present in a fourth column bank.

As shown in FIG. 10A, according to the display panel 911, the sets 60 are disposed without gaps therebetween in the X-axis direction. The red organic material ink 16IR enters into a sub pixel region adjacent to the defective portion 30F in which the blue organic material ink 16IB is applied, and overflows third row banks 40C one by one in directions "up" and "down" the page in FIG. 10A. Similarly, the blue organic material ink 16IB enters into a sub pixel region adjacent to the defective portion 30F in which the red organic material ink 16IR is applied, and overflows first row banks 40A one by one in directions "up" and "down" the page in FIG. 10A. Thus, mixed color ink 16IBR becomes present in sub pixel regions adjacent to the defective portion 30F, and in sub pixel region adjacent to these sub pixel regions, for a total of six sub pixel regions, and when this ink is dried to become organic light-emitting layers, six defective organic light-emitting elements occur in the display panel 921.

Figure 10B:
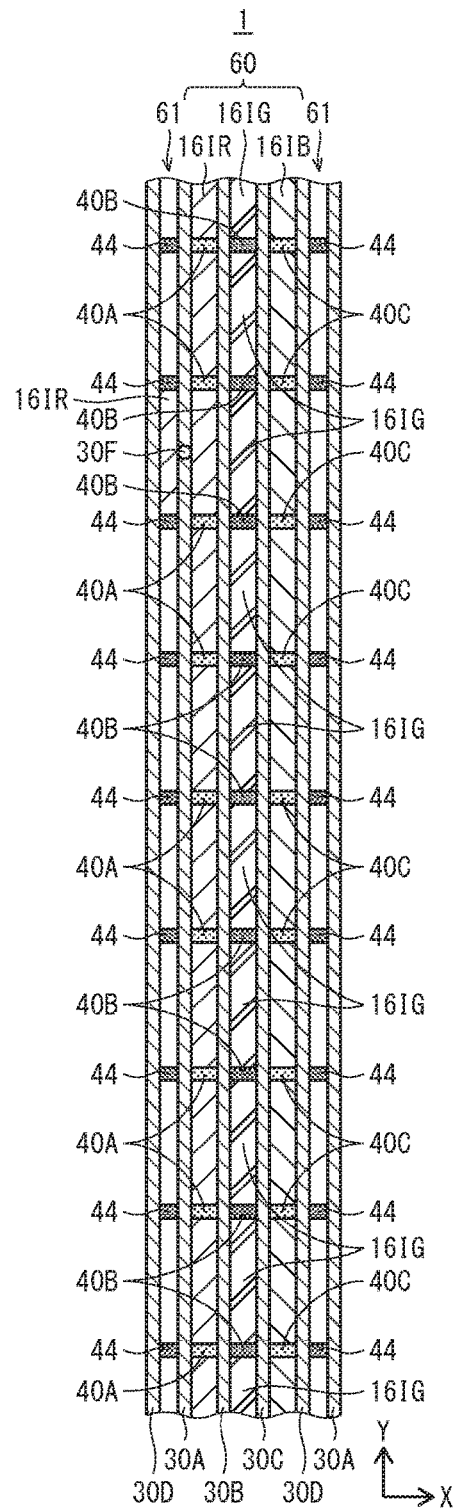

As shown in FIG. 10B, according to the display panel 1, red organic material ink 16IR enters one of the gaps 61 adjacent to the defective portion 30F via the defective portion 30F. Thus, unlike the display panel 911 in which organic light-emitting elements are provided on both sides of the defective portion 30F, mixed color ink does not occur, and therefore variation in brightness of the display panel 1 is suppressed. Note that an amount of the red organic material ink 16IR held in the sub pixel region to which it was applied decreases by the amount that flows into the gap 61 from the sub pixel region, but influence of this decrease in ink amount is smaller than influence of ink mixing.

Further, according to the display panel 1, the auxiliary electrodes 50 are provided in the gaps 61 to supply power to the upper electrode 19. Thus, a constant voltage can be applied across the upper electrode 19.

<High Row Banks on Auxiliary Electrodes>

Figure 11A:
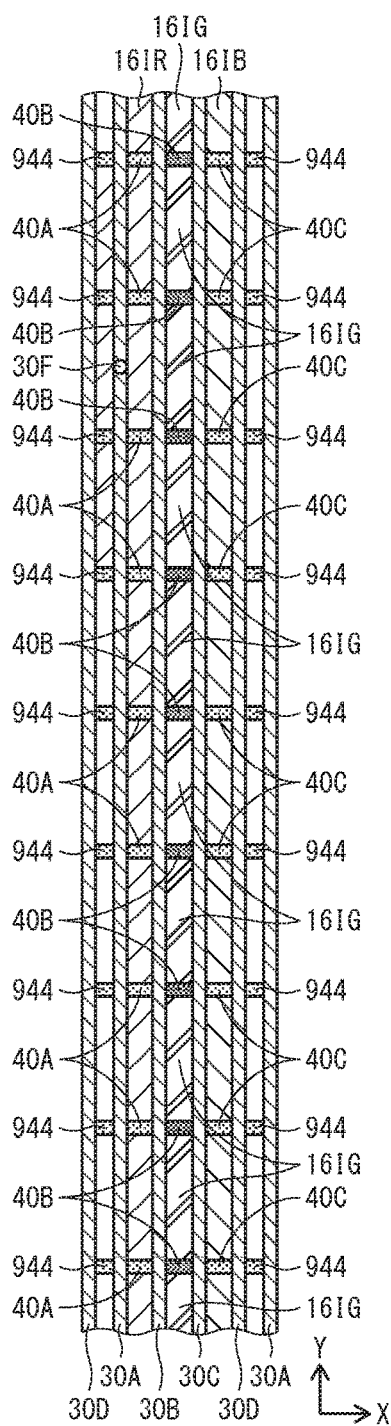
FIG. 11A and FIG. 11B are plan views immediately after ink is applied in a method of manufacturing a display panel when a defective portion is present in a fourth column bank.
Figure 11B:
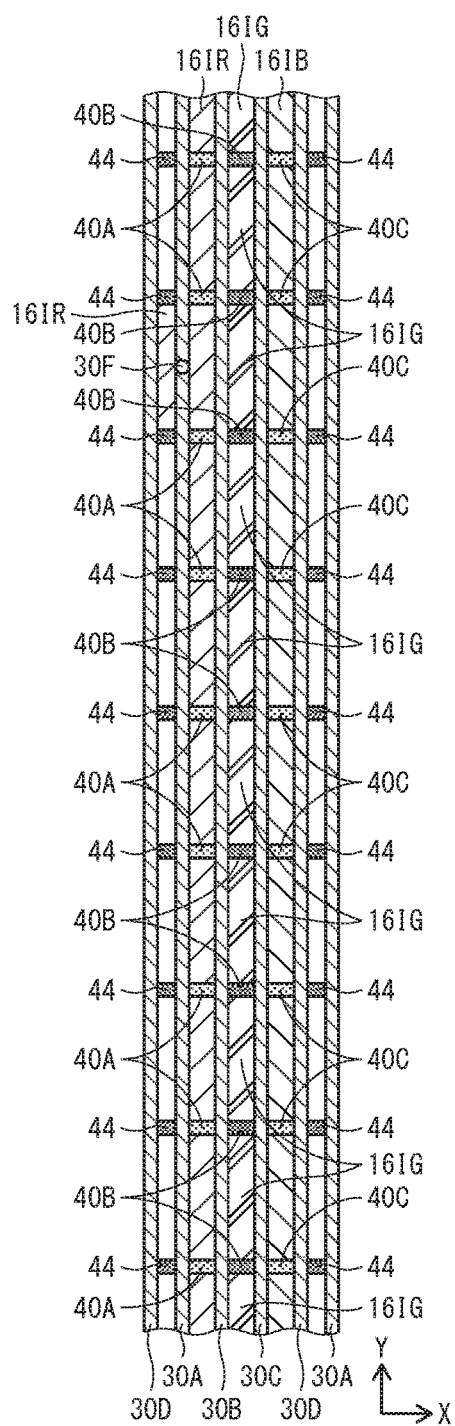

High row banks provided on auxiliary electrodes are examined with reference to FIG. 11A and FIG. 11B. These drawings show the display panel 1 in which a defective portion 30F is present in one of the first column banks 30A, in plan view immediately after applying organic material ink. The defective portion 30F in these drawings is an unintentionally missing part in one of the first column banks 30A. The following describes a display panel 921 pertaining to a comparative example. The display panel 921 pertaining to the comparative example has the same configuration as the display panel 1 pertaining to Embodiment 1, except that all of fourth row banks 944 are low row banks.

As shown in FIG. 11A, in the display panel 921, the red organic material ink 16IR enters a region between one of the first column banks 30A and one of the fourth column banks 30D via the defective portion 30F. The red organic material ink 16IR then overflows fourth row banks 944 in "up" and "down" directions of the page of FIG. 11A. Thus, volume of red organic material ink 16IR in a sub pixel region adjacent to the defective portion 30F is reduced by a volume of red organic material ink 16IR that flows into three sub-pixel regions in the region bounded by the one of the first column banks 30A and the one of the fourth column banks 30D. Subsequently, when the red organic material ink 16IR is dried to become the red organic light-emitting layers 16R, film thickness of a portion of the red organic light-emitting layers 16R in the display panel 921 becomes thin.

As shown in FIG. 11B, in the display panel 1 the red organic material ink 16IR also enters the region bounded by one of the first column banks 30A and one of the fourth column banks 30D via the defective portion 30F. However, the red organic material ink 16IR cannot overflow the fourth row banks 44. Thus, volume of red organic material ink 16IR in a sub pixel region adjacent to the defective portion 30F is reduced by a volume of red organic material ink 16IR that flows into one sub-pixel region in the region bounded by the one of the first column banks 30A and the one of the fourth column banks 30D. Subsequently, when the red organic material ink 16IR is dried to become the red organic light-emitting layers 16R, film thickness of a portion of the red organic light-emitting layers 16R in the display panel 1 becomes thin.

Thus, even when the defective portion 30F is present, volume of ink flowing to a sub pixel region adjacent to the defective portion 30F and from there to adjacent sub pixel regions in the Y-axis direction is decreased in the display panel 1, compared with the display panel 921. Thus, thinning of film thickness of the red organic light-emitting layers 16R can be suppressed. Thus, variation in film thickness of the red organic light-emitting layers 16R can be suppressed in the display panel 1, compared with the display panel 921.

Note that although, in the display panel 1, all the fourth row banks 44 disposed on the auxiliary electrodes 50 are high row banks, this is not a limitation, and portion of the fourth row banks 44 may be high row banks and a remainder low row banks. Even in such a case, spread of defective organic light-emitting elements caused by flow of ink due to the defective portion can be suppressed.

Embodiment 2

Figure 12:
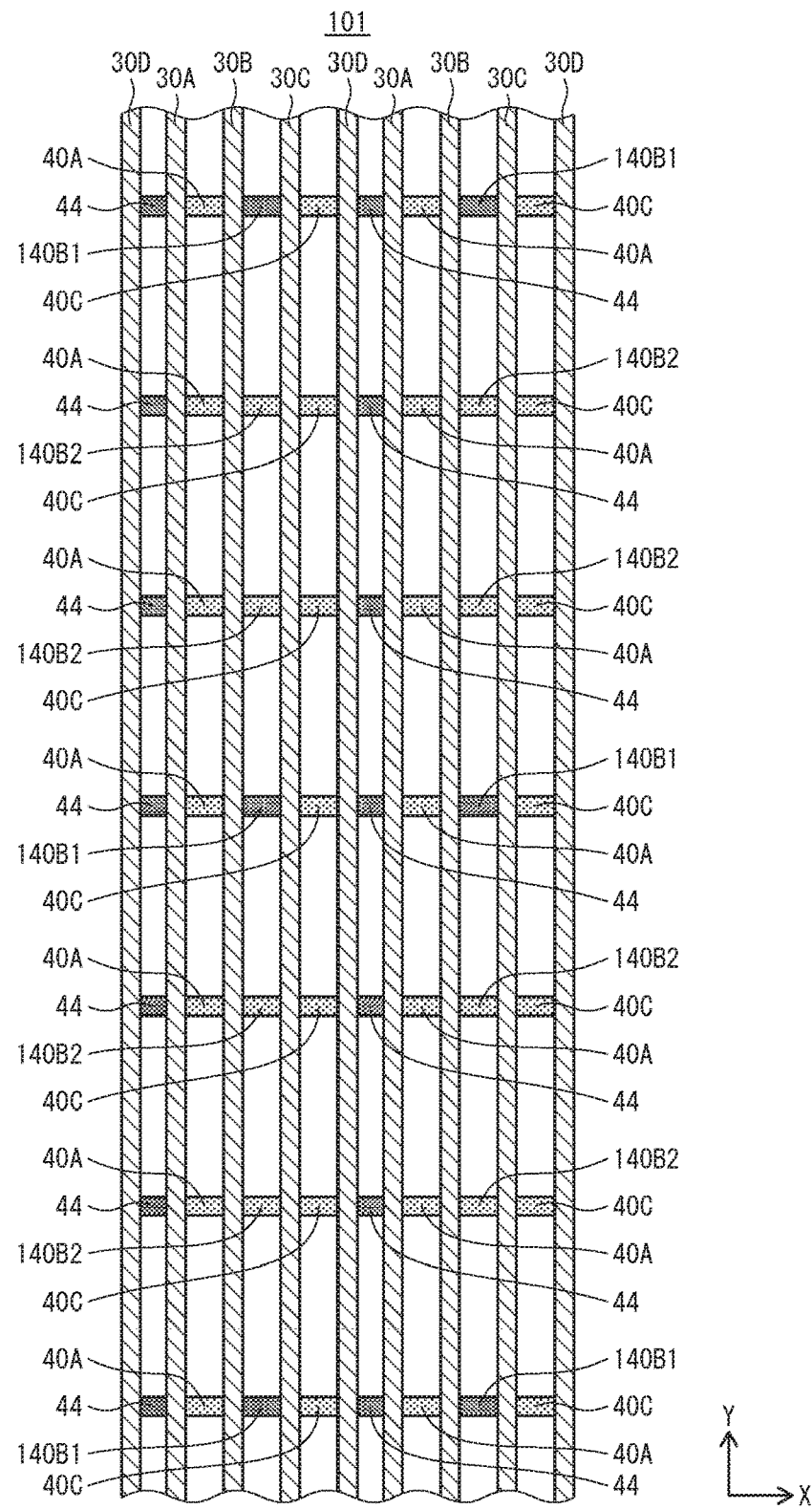
FIG. 12 shows a layout of column banks and row banks pertaining to Embodiment 2 of the present invention.

Basic configuration of display panel 101 of Embodiment 2 shown in the layout diagram of FIG. 12 is substantially the same as Embodiment 1. Embodiment 2 differs from Embodiment 1 in that "all of the second row banks are high row banks" becomes "a portion of the second row banks are high row banks and a remainder are low row banks". Elements identical to those in Embodiment 1 are assigned the same reference signs and description thereof is omitted as appropriate.

In the display panel 101, when viewing second row banks in the Y-axis direction, each pair of second row banks 140B1 sandwiches two second row banks 140B2. The second row banks 140B1 are high row banks and the second row banks 140B2 are low row banks. That is, according to the display panel 101, each pair of the second row banks 140B1 (high row banks) is evenly spaced and sandwiches two of the second row banks 140B2 (low row banks). Note that here "evenly spaced" does not necessarily mean that a physical distance between the high row banks is equal, but that a number of low row banks between high row banks is equal. Even according to this configuration, the number of high row banks provided between adjacent ones of the green organic light-emitting elements 11G is greater than the number of high row banks provided between adjacent ones of the red organic light-emitting elements 11R and greater than the number of high row banks provided between adjacent ones of the blue organic light-emitting elements 11B. Thus, with respect to the red organic light-emitting elements 11R and the blue organic light-emitting elements 11B for which brightness is greatly influenced by variation in film thickness of organic functional layers, variation in properties of organic light-emitting elements due to variation in film thickness of organic functional layers is considered important, while spread of defective organic light-emitting elements due to a defective portion is suppressed for the display panel 1 as a whole.

A configuration as in the display panel 101, in which each of the high row banks is sandwiched between two low row banks in the Y-axis direction, is not a limitation, and spread of defective organic light-emitting elements due to defective portions can be suppressed by disposing high row banks in a region in which ink spreads in the column direction after entering the region via a defective portion. Typically, ink that passes through a defective portion of a column bank spreads "up" and "down" ten sub pixels regions from the sub pixel region entered. Thus, by adopting a configuration in which 19 or less low row banks are sandwiched between high row banks in the Y-axis direction, spread of defective organic light-emitting elements due to a defective portion can be suppressed.

Embodiment 3

Figure 13:
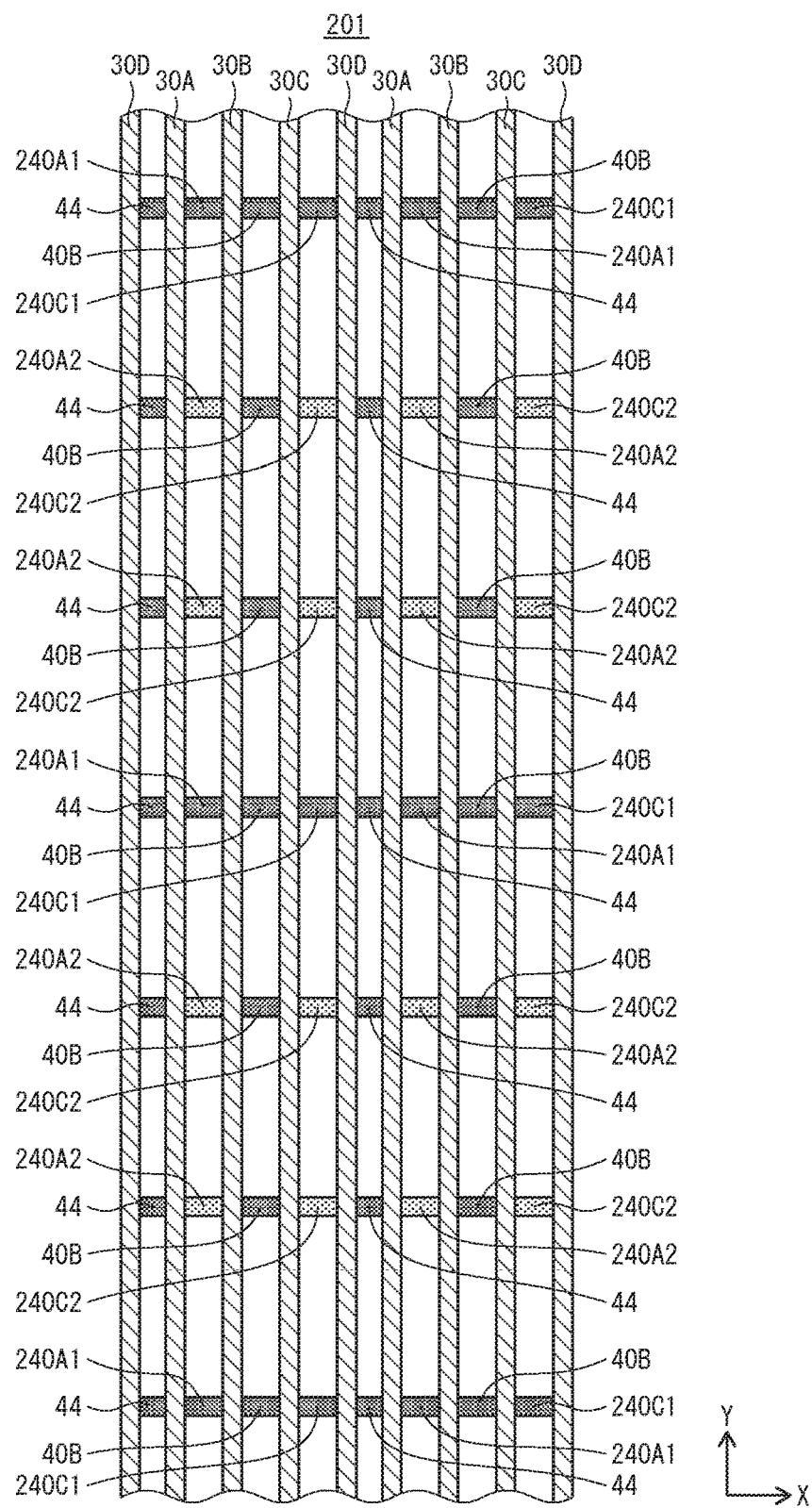
FIG. 13 shows a layout of column banks and row banks pertaining to Embodiment 3 of the present invention.

Basic configuration of display panel 201 of Embodiment 3 shown in the layout diagram of FIG. 13 is substantially the same as Embodiment 1. Embodiment 2 differs from Embodiment 1 in that "all of the first row banks and all of the third row banks are low row banks" becomes "a portion of the first row banks are high row banks and a remainder are low row banks, and a portion of the third row banks are high row banks and a remainder are low row banks". Elements identical to those in Embodiment 1 are assigned the same reference signs and description thereof is omitted as appropriate.

In the display panel 201, when viewing first row banks in the Y-axis direction, each of first row banks 240A1 is disposed between two first row banks 240A2. That is, according to the display panel 201, each of the first row banks 240A1 (high row banks) is evenly spaced and sandwiched between two of the first row banks 240A2 (low row banks). Even according to this configuration, the number of high row banks provided between adjacent ones of the green organic light-emitting elements 11G is greater than the number of high row banks provided between adjacent ones of the red organic light-emitting elements 11R and greater than the number of high row banks provided between adjacent ones of the blue organic light-emitting elements 11B. Thus, with respect to the red organic light-emitting elements 11R and the blue organic light-emitting elements 11B for which brightness is greatly influenced by variation in film thickness of organic functional layers, variation in properties of organic light-emitting elements due to variation in film thickness of organic functional layers is considered important, while spread of defective organic light-emitting elements due to a defective portion is suppressed for the display panel 1 as a whole.

Embodiment 4

Figure 14:
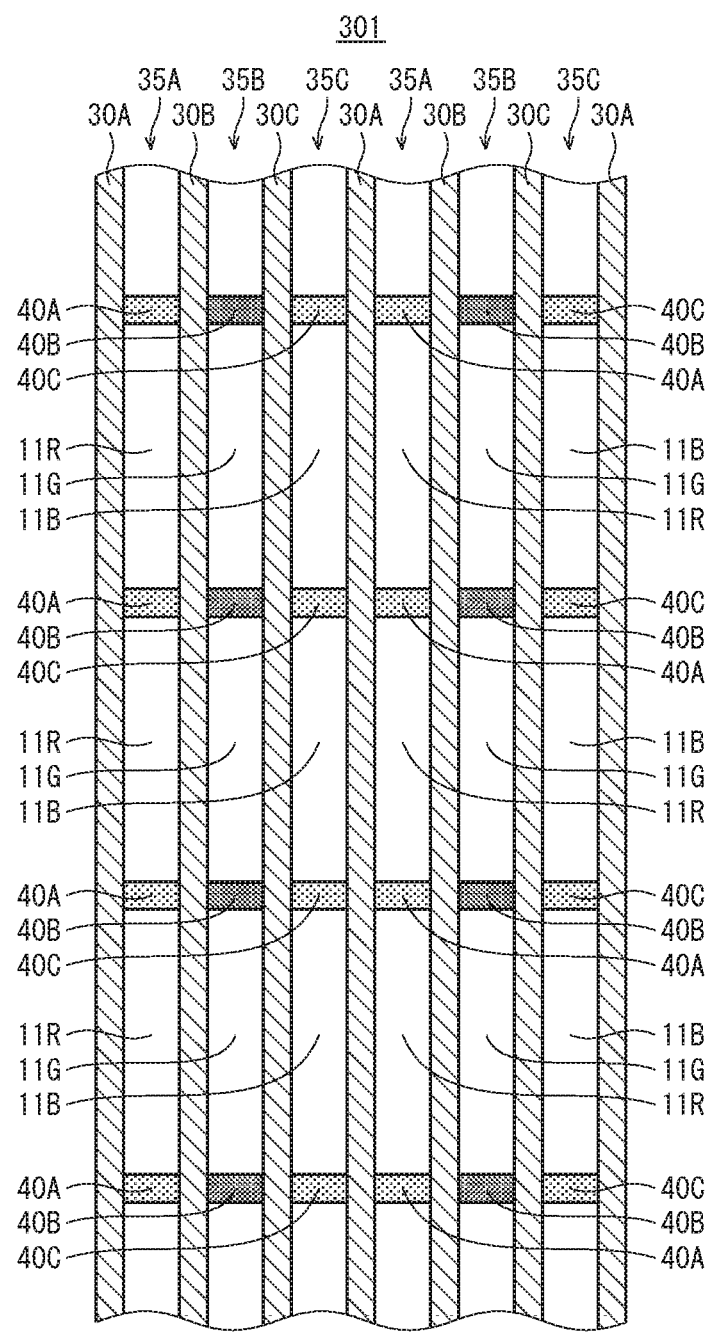
FIG. 14 shows a layout of column banks, row banks, and organic light-emitting elements pertaining to Embodiment 4 of the present invention.

Basic configuration of display panel 301 of Embodiment 4 shown in the layout diagram of FIG. 14 is substantially the same as Embodiment 1. Embodiment 4 differs from Embodiment 1 in that "there is a gap between sets, and an auxiliary electrode is disposed in the gap" becomes "there is no gap between sets". Elements identical to those in Embodiment 1 are assigned the same reference signs and description thereof is omitted as appropriate.

In the display panel 301, sets each consisting of the red organic light-emitting elements 11R, the green organic light-emitting elements 11G, the blue organic light-emitting elements 11B, the first column banks 30A, the second column banks 30B, and the third column banks 30C are disposed adjacent to each other without a gap therebetween. Even in this configuration, the number of high row banks in the second column region is greater than the number of high row banks in the first column region and greater than the number of high row banks in the third column region. Thus, with respect to the red organic light-emitting elements 11R and the blue organic light-emitting elements 11B for which brightness is greatly influenced by variation in film thickness of organic functional layers, variation in properties of organic light-emitting elements due to variation in film thickness of organic functional layers is considered important, while spread of defective organic light-emitting elements due to a defective portion is suppressed for the display panel 1 as a whole.

Further, according to the display panel 301, more element columns can be arranged than in a configuration in which the sets have gaps therebetween. Thus, according to the display panel 301, a higher resolution in the same panel size can be implemented than in a configuration in which the sets have gaps therebetween. Size of the display panel 301 can be decreased. Further, according to the display panel 301, when compared to a configuration at the same resolution in which the sets have gaps therebetween, sub pixel regions can be made larger, improving aperture ratio.

Embodiment 5

Figure 15:
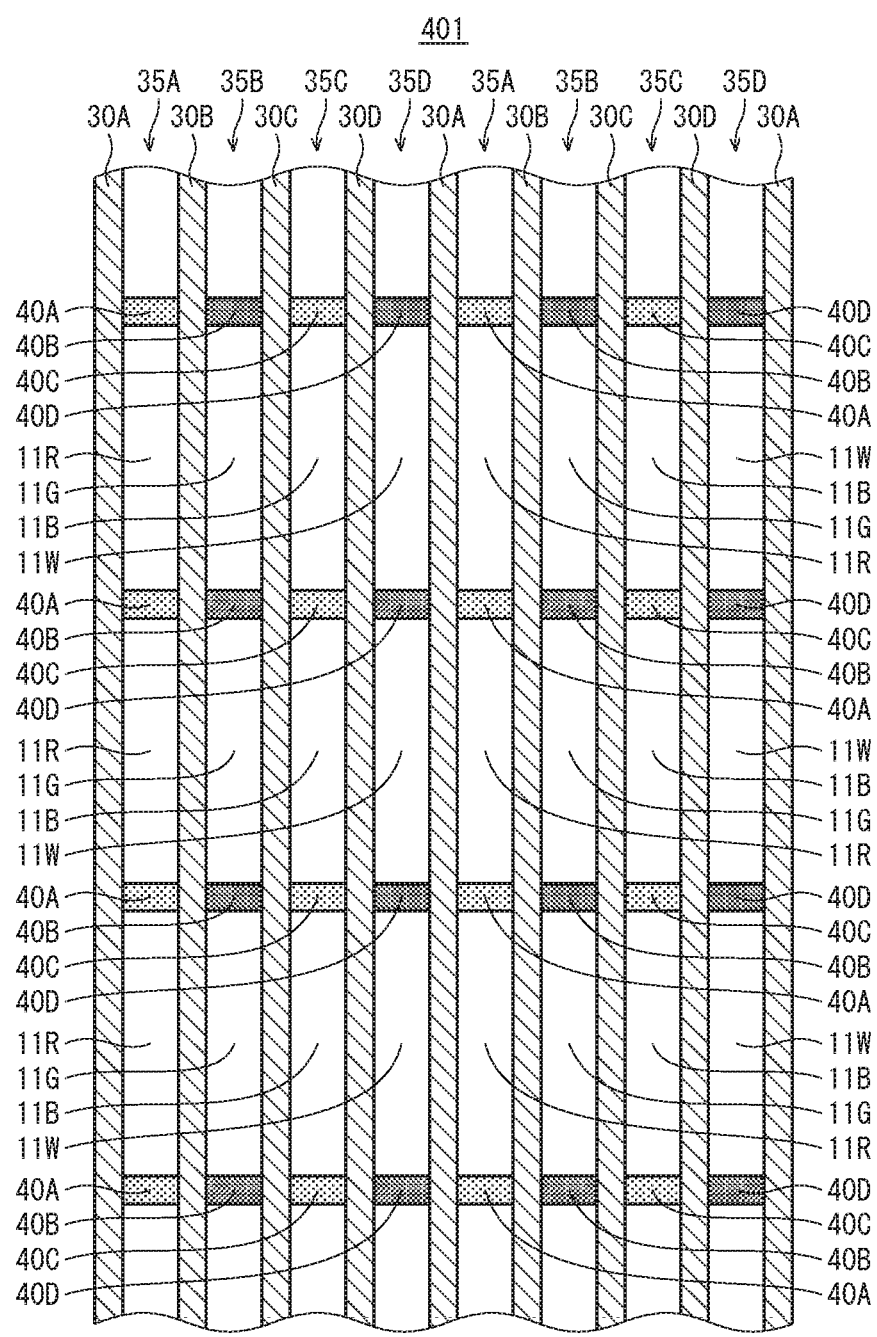
FIG. 15 shows a layout of column banks, row banks, and organic light-emitting elements pertaining to Embodiment 5 of the present invention.

Basic configuration of display panel 401 of Embodiment 5 shown in the layout diagram of FIG. 15 is substantially the same as Embodiment 1. Embodiment 5 differs from Embodiment 4 in that "red organic light-emitting elements, green organic light-emitting elements, and blue organic light-emitting elements" becomes "red organic light-emitting elements, green organic light-emitting elements, blue organic light-emitting elements, and white organic light-emitting elements". Elements identical to those in Embodiment 4 are assigned the same reference signs and description thereof is omitted as appropriate.

In the display panel 501, sets each consisting of the red organic light-emitting elements 11R, the green organic light-emitting elements 11G, the blue organic light-emitting elements 11B, white organic light-emitting elements 11W, the first column banks 30A, the second column banks 30B, the third column banks 30C, and fourth column banks 30D are disposed adjacent to each other without a gap therebetween. The fourth column banks 30D are disposed between the blue organic light-emitting elements 11B and the white organic light-emitting elements 11W. A plurality of fourth row banks 40D are spaced at intervals in the column direction in fourth column regions 35D between the first column banks 30A and the fourth column banks 30A. All of the fourth row banks 40D are high row banks.

According to the display panel 401, even if a defective portion occurs in one of the third column banks 30C, all of the fourth row banks 40D are high row banks and therefore spread of defective organic light-emitting elements due to defective portions can be suppressed.

<<Modifications>>

1. Configuration of Column Banks and Row Banks (1-1) Arrangement of High Row Banks when No Gap is Provided Between Sets According to Embodiment 4, all of the second row banks are high row banks, all of the first row banks are low row banks, and all of the third row banks are low row banks. However, this is not a limitation, and a configuration may be used in which all of the second row banks are low row banks, all of the first row banks are high row banks, and all of the third row banks are high row banks. In this case, the number of high row banks is greater than in Embodiment 4, and therefore spread of defective organic light-emitting elements due to defective portions is further suppressed.

(1-2) Layout of High Row Banks in Each Column Region

According to the embodiments described above, high row banks in each of the column regions are evenly spaced. However, this is not a limitation, and high row banks in each of the column regions may be arranged with different spacing. Even with this configuration, mixed ink occurring to a defective portion in a column bank does not spread over high row banks. Thus, spread of defective organic light-emitting elements caused by flow of ink due to the defective portion can be suppressed.

(1-3) Layout of High Row Banks in Display Panel

According to the embodiments described above, high row banks are evenly distributed in the display panel. However, this is not a limitation, and high row banks may be unevenly distributed. For example, when defective portions easily occur in column banks in a peripheral portion of a display panel, a high number of high row banks may be disposed in column regions in the peripheral portion.

(1-4) Manufacturing Process of Column Banks and Row Banks

According to the embodiments described above, the column banks and row banks are manufactured in a two processes of forming low row banks and forming high row banks. However, this is not a limitation, and column banks and row banks may be manufactures in one process. In this case, it suffices that a bank material film of a height equivalent to high row banks and column banks is formed on the substrate on which lower electrodes and a hole injection layer are formed, a mask is used to perform light exposure, in which openings are where high row banks and column banks are to be formed and halftone masking is where low row banks are to be formed, patterning is performed by using a developer, and then baking is performed. By manufacturing column banks and row banks in one process, manufacturing processes can be reduced.

Further, column banks and row banks may be manufactured in a process of forming low row banks and high row banks and a process of forming column banks.

(1-5) Liquid-Repellant Treatment of Column Banks and High Row Banks

Although not described in the embodiments above, as a material of column banks and high row banks, a fluorinated negative-type photoresist surface-treated to be liquid repellent may be used. More specifically, a material including perfluorooctanoic acid (PFOA) ammonium salt can be used as a fluorinated negative-type photoresist.

(1-6) Material of Column Banks and Row Banks

According to the embodiments described above, material of organic bank layers in column banks is an acrylic resin, but alternatively materials such as polyimide resin, siloxane resin, or phenolic resin may be used.

(1-7) Defective Portions of Column Banks

According to the embodiments described above, an unintentionally missing part is described as a defective portion of a column bank. However, this not a limitation, and, for example, height of a portion of a column bank being lower than intended and foreign matter unintentionally falling in a part of the column bank are included as defective portions occurring in column banks. The following describes a case of foreign matter falling in a column bank. In a process of forming an organic light-emitting layer, ink applied to a sub pixel region adjacent in the row direction have a bulging shape and edges of the ink may creep up to a top surface of the column bank. In such a case, for example, when foreign matter adheres to a gap in the column banks between adjacent inks, the ink cannot be blocked at the foreign matter portion and the ink is connected via the foreign matter. In such a case, a problem occurs due to mixed ink.

(1-8) Column Regions in which High Row Banks are Disposed

According to the embodiments described above, a column region in which high row banks are disposed is determined based on the influence on brightness of film thickness variation of an organic light-emitting material contained in ink applied by a wet process. However, this is not a limitation, and may be determined, for example, based on influence on lifespan of film thickness variation of an organic light-emitting material contained in ink applied by a wet process. In this case, more high row banks may be disposed in a column region in which ink is applied containing an organic light-emitting material for which film thickness variation has little influence on lifespan.

2. Overall Configuration

According to the embodiments described above, an example is used of a top-emission type of display panel, but the same effects may be obtained when the present invention is applied to a bottom-emission type of display panel.

3. Elements

<Substrate>

According to the embodiments described above, a substrate is formed by a TFT layer and an interlayer insulating layer on a glass substrate, but instead of a glass substrate a plastic substrate may be used. In such a case, instead of a glass substrate, for example, polyolefin such as polyethylene, polypropylene, ethylene-propylene copolymer, ethylene-vinyl acetate copolymer (EVA), cyclic polyolefin, modified polyolefin, polyvinyl chloride, polyvinylidene chloride, polystyrene, polyamide, polyimide (PI), polyamide-imide, polycarbonate, poly-(4-methyl-1-pentene), ionomer, acrylic resin, polymethyl methacrylate, styrene acrylonitrile copolymer (AS resin), butadiene styrene copolymer, ethylene vinyl alcohol (EVOH), polyethylene terephthalate (PET), polybutylene terephthalate, polyethylene naphthalate (PEN), polyester such as polycyclohexylenedimethylene terephthalate (PCT), polyether, polyether ketone, polyether sulfone (PES), polyetherimide, polyacetal, polyphenylene oxide, modified polyphenylene oxide, polyarylate, aromatic polyester (liquid crystal polymer), polytetrafluoroethylene, polyvinylidene fluoride, other fluorine-based resins, various thermoplastic elastomers such as styrene-based, polyolefin-based, polyvinylidene chloride-based, polyurethane-based, fluorine rubber-based, or chlorinated polyethylene-based thermoplastic elastomers, epoxy resin, phenol resin, urea resin, melamine resin, unsaturated polyester, silicone resin, polyurethane, or a copolymer, blend, polymer alloy, etc., primarily consisting of one of the above, or a layered body including layers of one or more of the above can be used. Further, in a case of using a plastic substrate, a flexible plastic substrate may be used.

<Lower Electrodes>

According to the embodiments described above, lower electrodes are single-layer structures made from a metal material, but may alternatively be stacked layers of metal and light-transmissive electrically-conductive material. As a light-transmissive electrically-conductive material, indium tin oxide (ITO) or indium zinc oxide (IZO) may be used, for example.

<Organic Functional Layers>

According to the embodiments described above, hole transport layers, organic light-emitting layers, an electron transport layer, and an electron injection layer are used as organic functional layers sandwiched between lower electrodes and an upper electrode, but this is not a limitation, and an electron block layer or buffer layer may be added to a hole transport layer and light-emitting layer as organic functional layers. Further, organic light-emitting layers may be the only organic functional layers.

According to the embodiments described above, red (R), green (G), blue (B), and white (W) are examples of light-emission colors of organic light-emitting layers. However, this is not a limitation, and light-emission colors such as deep blue may be used as light-emission colors of light-emitting layers.

Further, according to the embodiments described above, different light-emission colors of organic light-emitting elements are implemented by providing different light-emission colors of organic light-emitting layers between lower electrodes and upper electrode. However, this is not a limitation, and different light-emission colors of organic light-emitting elements may be implemented by providing identical light-emission colors of organic light-emitting layers between lower electrodes and upper electrode, while providing a color filter layer in a light emission direction from the upper electrode. In this case, for example, organic light-emitting layers that emit white light may be combined with a color filter layer that selectively transmits wavelengths of visible light for each of red (R), green (G), and blue (B).

The present invention is applicable to displays of various types of electronic devices.

Although the present invention has been described by way of examples with reference to the accompanying drawings, it is to be noted that various changes and modifications will be apparent to those skilled in the art. Therefore, unless such changes and modifications depart from the scope of the present invention, they should be construed as being included therein.

The invention claimed is:

1. A display panel comprising:
   a substrate;
   a first column bank, a second column bank, and a third column bank, disposed at spaced intervals on the substrate, each being elongated in a column direction;
   a plurality of first row banks disposed at spaced intervals in the column direction on the substrate in a first column region between the first column bank and the second column bank;
   a plurality of second row banks disposed at spaced intervals in the column direction on the substrate in a second column region between the second column bank and the third column bank;
   a plurality of first organic light-emitting elements disposed on the substrate in the first column region between adjacent ones of the first row banks; and
   a plurality of second organic light-emitting elements disposed on the substrate in the second column region between adjacent ones of the second row banks, emitting light in a color different from that of the first organic light-emitting elements, wherein
   the first row banks and the second row banks collectively include low row banks that have a height from a top surface of the substrate that is lower than that of the first column bank, the second column bank, and the third column bank, and high row banks that have a height from the top surface of the substrate that is higher than that of the low row banks, and
   a number of high row banks between adjacent ones of the first organic light-emitting elements is different from a number of high row banks between adjacent ones of the second organic light-emitting elements.

2. The display panel of claim 1, wherein
   the number of the high row banks disposed between adjacent ones of the first light-emitting elements is three or more, and
   the high row banks disposed between adjacent ones of the first light-emitting elements are spaced at equal intervals.

3. The display panel of claim 2, wherein
   all the first row banks are high row banks.

4. The display panel of claim 1, wherein
   all the second row banks are low row banks.

5. The display panel of claim 1, wherein
   the number of high row banks between adjacent ones of the first organic light-emitting elements is greater than the number of high row banks between adjacent ones of the second organic light-emitting elements,
   each of the first organic light-emitting elements includes an organic light-emitting layer that contains a first organic light-emitting material,
   each of the second organic light-emitting elements includes an organic light-emitting layer that contains a second organic light-emitting material that is different from the first organic light-emitting material, and
   the first organic light-emitting material has properties such that influence on brightness of differences in thickness of the organic light-emitting layer containing the first organic light-emitting material is less than influence on brightness of differences in thickness of the organic light-emitting layer containing the second organic light-emitting material.

6. The display panel of claim 5, wherein
   the first organic light-emitting material is a material emitting red light, and
   the second organic light-emitting material is a material emitting blue light or a material emitting green light.

7. The display panel of claim 1, wherein
   each of the first organic light-emitting elements includes an organic light-emitting layer that contains a first organic light-emitting material,
   each of the second organic light-emitting elements includes an organic light-emitting layer that contains a second organic light-emitting material that is different from the first organic light-emitting material,
   the number of high row banks between adjacent ones of the first organic light-emitting elements is greater than the number of high row banks between adjacent ones of the second organic light-emitting elements,
   the first organic light-emitting material is a material emitting red light, and
   the second organic light-emitting material is a material emitting blue light or a material emitting green light.

8. The display panel of claim 1, further comprising:
   a fourth column bank disposed on the substrate spaced apart from the third column bank and elongated in the column direction;
   a plurality of third row banks disposed at spaced intervals in the column direction on the substrate in a third column region between the third column bank and the fourth column bank; and
   a plurality of third organic light-emitting elements disposed on the substrate in the third column region between adjacent ones of the third row banks, emitting light in a color different from that of the first organic light-emitting elements and different from that of the second organic light-emitting elements, wherein
   the number of high row banks between adjacent ones of the second organic light-emitting elements is greater than the number of high row banks between adjacent ones of the first organic light-emitting elements, and is greater than the number of high row banks between adjacent one of the third organic light-emitting elements,
   a plurality of sets are disposed at spaced intervals on the substrate along a direction perpendicular to the column direction, each set consisting of the first column bank, the first organic light-emitting elements, the second column bank, the second organic light-emitting elements, the third column bank, the third organic light-emitting elements, and the fourth column bank, and
   a plurality of auxiliary electrodes are disposed on the substrate in gaps between the sets, each extending in the column direction and supplying power to the first organic light-emitting elements, the second organic light-emitting elements, and the third organic light-emitting elements.

9. The display panel of claim 1, further comprising:
a fourth column bank disposed on the substrate spaced apart from the third column bank and elongated in the column direction;
a plurality of third row banks disposed at spaced intervals in the column direction on the substrate in a third column region between the third column bank and the fourth column bank; and
a plurality of third organic light-emitting elements disposed on the substrate in the third column region between adjacent ones of the third row banks, emitting light in a color different from that of the first organic light-emitting elements and different from that of the second organic light-emitting elements, wherein
the number of high row banks between adjacent ones of the second organic light-emitting elements is greater than the number of high row banks between adjacent ones of the first organic light-emitting elements, and is greater than the number of high row banks between adjacent ones of the third organic light-emitting elements,
a plurality of sets are disposed at spaced intervals on the substrate along a direction perpendicular to the column direction, each set consisting of the first column bank, the first organic light-emitting elements, the second column bank, the second organic light-emitting elements, the third column bank, the third organic light-emitting elements, and the fourth column bank,
a plurality of auxiliary electrodes are disposed on the substrate in gaps between the sets, each extending in the column direction and supplying power to the first organic light-emitting elements, the second organic light-emitting elements, and the third organic light-emitting elements, and
one or more fourth row banks are disposed on each of the auxiliary electrodes.

10. The display panel of claim 1, further comprising:
a plurality of third row banks disposed at spaced intervals in the column direction on the substrate in a third column region that, together with the second column region, sandwiches the third column bank; and
a plurality of third organic light-emitting elements disposed on the substrate in the third column region between adjacent ones of the third row banks, emitting light in a color different from that of the first organic light-emitting elements and different from that of the second organic light-emitting elements, wherein
the number of high row banks between adjacent ones of the second organic light-emitting elements is greater than the number of high row banks between adjacent ones of the first organic light-emitting elements, and is greater than the number of high row banks between adjacent ones of the third organic light-emitting elements, and
a plurality of sets are disposed adjacent to each other on the substrate along a direction perpendicular to the column direction, each set consisting of the first column bank, the first organic light-emitting elements, the second column bank, the second organic light-emitting elements, the third column bank, and the third organic light-emitting elements.

11. The display panel of claim 1, further comprising:
a plurality of third row banks disposed at spaced intervals in the column direction on the substrate in a third column region that, together with the second column region, sandwiches the third column bank; and
a plurality of third organic light-emitting elements disposed on the substrate in the third column region between adjacent ones of the third row banks, emitting light in a color different from that of the first organic light-emitting elements and different from that of the second organic light-emitting elements, wherein
the number of high row banks between adjacent ones of the second organic light-emitting elements is greater than the number of high row banks between adjacent ones of the first organic light-emitting elements, and is greater than the number of high row banks between adjacent ones of the third organic light-emitting elements, and
a plurality of sets are disposed at spaced intervals on the substrate along a direction perpendicular to the column direction, each set consisting of the first column bank, the first organic light-emitting elements, the second column bank, the second organic light-emitting elements, the third column bank, and the third organic light-emitting elements.

12. The display panel of claim 1, further comprising:
a fourth column bank disposed on the substrate spaced apart from the third column bank and elongated in the column direction;
a plurality of third row banks disposed at spaced intervals in the column direction on the substrate in a third column region between the third column bank and the fourth column bank;
a plurality of fourth row banks disposed at spaced intervals in the column direction on the substrate in a fourth column region that, together with the third column region, sandwiches the fourth column bank;
a plurality of third organic light-emitting elements disposed on the substrate in the third column region between adjacent ones of the third row banks, emitting light in a color different from that of the first organic light-emitting elements and different from that of the second organic light-emitting elements; and
a plurality of fourth organic light-emitting elements disposed on the substrate in the fourth column region between adjacent ones of the fourth row banks, emitting light in a color different from that of the first organic light-emitting elements, different from that of the second organic light-emitting elements, and different from that of the third organic light-emitting elements, wherein
the number of high row banks between adjacent ones of the second organic light-emitting elements is greater than the number of high row banks between adjacent ones of the first organic light-emitting elements, and is greater than the number of high row banks between adjacent ones of the third organic light-emitting elements,
the number of high row banks between adjacent ones of the fourth organic light-emitting elements is greater than the number of high row banks between adjacent ones of the first organic light-emitting elements, and is greater than the number of high row banks between adjacent ones of the third organic light-emitting elements, and
a plurality of sets are disposed adjacent to each other on the substrate along a direction perpendicular to the column direction, each set consisting of the first column bank, the first organic light-emitting elements, the second column bank, the second organic light-emitting elements, the third column bank, the third organic light-emitting elements, the fourth column bank, and the fourth organic light-emitting elements.

13. The display panel of claim 12, wherein
all the second row banks and all the fourth row banks are high row banks, and
all the first row banks and all the third row banks are low row banks.

14. The display panel of claim 1, wherein
each of the first organic light-emitting elements includes an organic light-emitting layer that contains a first organic light-emitting material,
each of the second organic light-emitting elements includes an organic light-emitting layer that contains a second organic light-emitting material that is different from the first organic light-emitting material, and
height from the top surface of the substrate to top surfaces of the organic light-emitting layers that contain the first organic light-emitting material or the second organic light-emitting material is higher than height from the top surface of the substrate to top surfaces of the low row banks and lower than height from the top surface of the substrate to top surfaces of the high row banks.

\* \* \* \* \*